(12) United States Patent
Ko et al.

(10) Patent No.: US 12,112,942 B2
(45) Date of Patent: Oct. 8, 2024

(54) DEPOSITION PROCESS FOR FORMING SEMICONDUCTOR DEVICE AND SYSTEM

(71) Applicant: Taiwan Semiconductor Manufacturing Co., Ltd., Hsinchu (TW)

(72) Inventors: Chung-Ting Ko, Kaohsiung (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 122 days.

(21) Appl. No.: 17/818,823

(22) Filed: Aug. 10, 2022

(65) Prior Publication Data

US 2022/0384179 A1    Dec. 1, 2022

Related U.S. Application Data

(62) Division of application No. 16/943,020, filed on Jul. 30, 2020, now Pat. No. 11,532,475.

(60) Provisional application No. 62/953,335, filed on Dec. 24, 2019.

(51) Int. Cl.
*H01L 21/02* (2006.01)
*C23C 16/455* (2006.01)
(Continued)

(52) U.S. Cl.
CPC .... *H01L 21/0228* (2013.01); *C23C 16/45525* (2013.01); *H01L 21/823431* (2013.01);
(Continued)

(58) Field of Classification Search
CPC ............... H01L 21/0228; H01L 21/443; H01L 21/0217; H01L 21/02178; H01L 21/02181;
(Continued)

(56) References Cited

U.S. PATENT DOCUMENTS 10,354,923 B2   7/2019  Huang et al.
10,504,782 B2   12/2019 Suen et al.
(Continued)

FOREIGN PATENT DOCUMENTS

DE   102017208289 A1   11/2017
KR   20120089792 A     8/2012
(Continued)

OTHER PUBLICATIONS

Lovikka, Ville A. et al., "Reversely Toposelective Vapor Deposition at Normal Pressure and Temperature by Capillary Condensation," Materials Horizons Communication, Mar. 11, 2019, pp. 1230-1237.

*Primary Examiner* — Thanhha S Pham
(74) *Attorney, Agent, or Firm* — Slater Matsil, LLP

(57) ABSTRACT

A method includes placing a semiconductor substrate in a deposition chamber, wherein the semiconductor substrate includes a trench, and performing an atomic layer deposition (ALD) process to deposit a dielectric material within the trench, including flowing a first precursor of the dielectric material into the deposition chamber as a gas phase; flowing a second precursor of the dielectric material into the deposition chamber as a gas phase; and controlling the pressure and temperature within the deposition chamber such that the second precursor condenses on surfaces within the trench as a liquid phase of the second precursor, wherein the liquid phase of the second precursor has capillarity.

20 Claims, 29 Drawing Sheets

(51) Int. Cl.
*H01L 21/443* (2006.01)
*H01L 21/8234* (2006.01)
*H01L 27/088* (2006.01)
*H01L 29/66* (2006.01)
*H01L 21/383* (2006.01)

(52) U.S. Cl.
CPC .... *H01L 27/0886* (2013.01); *H01L 29/66795* (2013.01); *H01L 21/383* (2013.01); *H01L 21/443* (2013.01)

(58) Field of Classification Search
CPC ......... H01L 21/02189; H01L 21/02211; H01L 21/02274; H01L 21/76834; H01L 21/76837; H01L 21/7689; H01L 29/66545; H01L 29/7848; H01L 29/66795; H01L 21/76804; H01L 21/823431; H01L 21/823475; H01L 27/0886; C23C 16/45525; C23C 16/45527; C23C 16/045; C23C 16/403; C23C 16/405
See application file for complete search history.

(56) References Cited

U.S. PATENT DOCUMENTS

| | | | |
|---|---|---|---|
| 10,770,288 B2 | 9/2020 | Chi et al. | |
| 2004/0023516 A1 | 2/2004 | Londergan et al. | |
| 2010/0178481 A1 | 7/2010 | George et al. | |
| 2011/0151678 A1 | 6/2011 | Ashtiani et al. | |
| 2011/0256726 A1 | 10/2011 | LaVoie et al. | |
| 2013/0203267 A1 | 8/2013 | Pomarede et al. | |
| 2014/0205905 A1 | 7/2014 | Xiao et al. | |
| 2015/0171216 A1* | 6/2015 | Xie | H01L 21/28035 257/401 |
| 2016/0218219 A1 | 7/2016 | Asami et al. | |
| 2017/0335454 A1 | 11/2017 | Furumura et al. | |
| 2018/0151694 A1 | 5/2018 | Wang et al. | |
| 2018/0175201 A1 | 6/2018 | Wang et al. | |
| 2019/0164828 A1 | 5/2019 | Khaderbad et al. | |
| 2019/0334008 A1 | 10/2019 | Chen et al. | |
| 2019/0348273 A1 | 11/2019 | Tang et al. | |

FOREIGN PATENT DOCUMENTS

| | | |
|---|---|---|
| KR | 20120099243 A | 9/2012 |
| KR | 20170106358 A | 9/2017 |
| KR | 20180060944 A | 6/2018 |
| KR | 20180069704 A | 6/2018 |
| KR | 20180131342 A | 12/2018 |
| KR | 20190038423 A | 4/2019 |
| KR | 20190062132 A | 6/2019 |
| KR | 102011946 B1 | 8/2019 |
| KR | 20190128558 A | 11/2019 |
| WO | 2011072143 A2 | 6/2011 |
| WO | 20160120741 A1 | 8/2016 |

* cited by examiner

DEPOSITION PROCESS FOR FORMING SEMICONDUCTOR DEVICE AND SYSTEM

PRIORITY CLAIM AND CROSS-REFERENCE

This application is a divisional of U.S. patent application Ser. No. 16/943,020, entitled "Deposition Process for Forming Semiconductor Device and System," filed on Jul. 30, 2020, which claims the benefit of U.S. Provisional Application No. 62/953,335, filed on Dec. 24, 2019, which applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
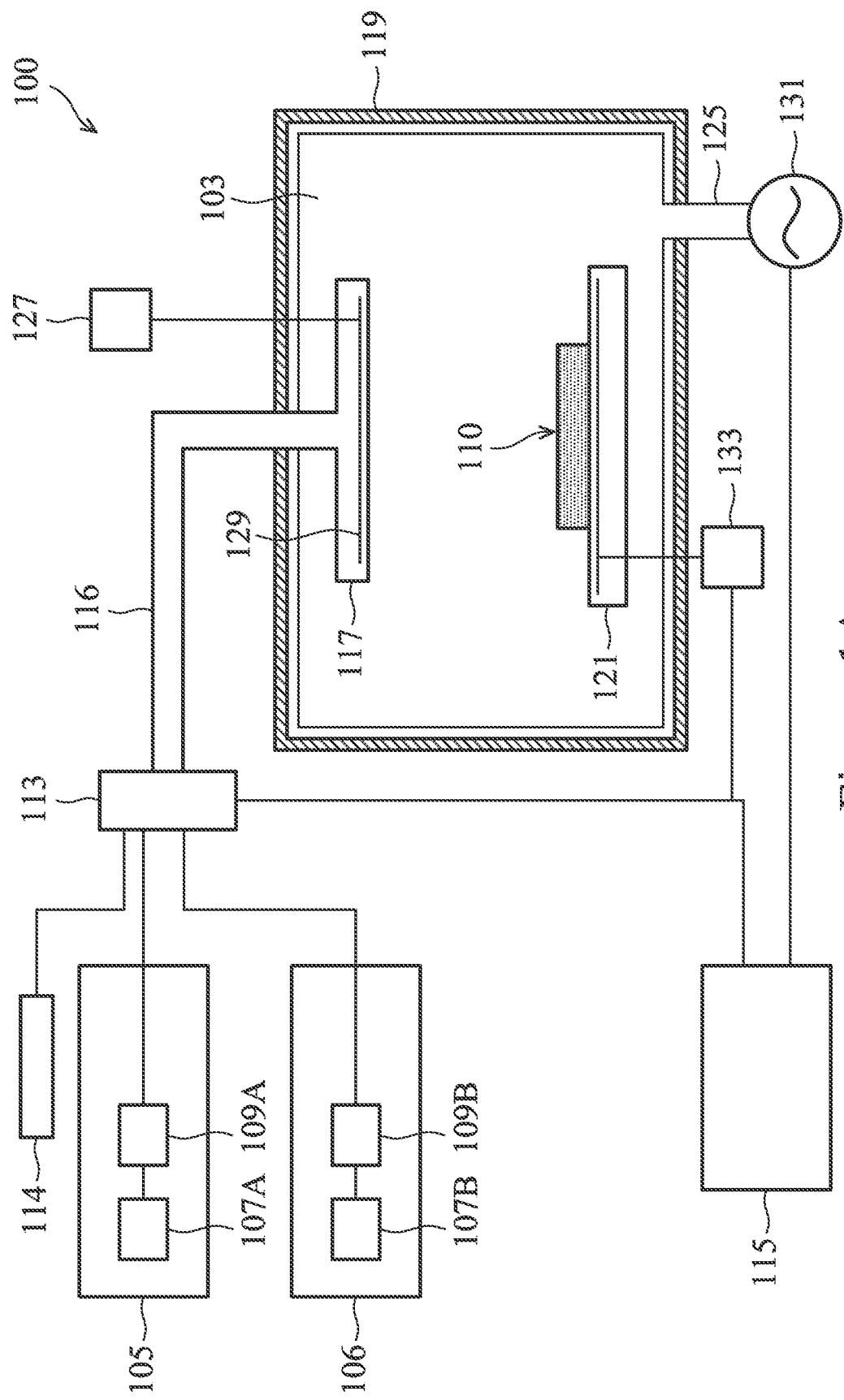
FIGS. 1A and 1B are illustrations of a deposition system used to perform a capillary-assisted atomic layer deposition (ALD) process, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for depositing gap-filling materials using capillary-assisted atomic layer deposition (ALD) process for performing a partial bottom-up deposition process. The capillary-assisted ALD process described herein includes controlling the process pressure and/or process temperature during an ALD process such that one or more precursors condenses on surfaces as a liquid. The precursor(s) may be chosen to be a suitable precursor that has capillarity when in a liquid phase. Due to the capillarity of the condensed precursor, the precursor can be drawn into deep or narrow spaces by capillary action. In this manner, material within these deep or narrow spaces can have a bottom-up-like growth, while the material can also have a conformal growth on more exposed or shallow surfaces. This allows the gap-filling deposition of material in deep or narrow spaces without the formation of defects such as seams or voids. The techniques described herein allow for improved material deposition using thermal ALD or plasma ALD without the use of inhibitors or other additives. Semiconductor devices formed according to the processes described herein can have fewer device defects and improved performance.

Some embodiments discussed herein are discussed in the context of FinFETs formed using a gate-last process. In other embodiments, a gate-first process may be used. Also, some embodiments contemplate aspects used in planar devices, such as planar FETs, or aspects used in nanostructure FETs (e.g., nanosheet or "gate-all-around" FETs or the like). Additionally the embodiments for a gap-filling deposition process described herein may be used in other steps in the formation of FinFETs than shown or may be used for forming other types of devices or structures. For example, the embodiments described herein may be used for forming other Front-End-of-Line (FEOL) features or Back-End-of-Line features, such as for forming passivation layers, insulation layers, sacrificial layers, spacers, contacts, vias, metal lines or other conductive routing, for gap-filling deposition steps in multi-patterning processes, or the like.

Figure 1B:
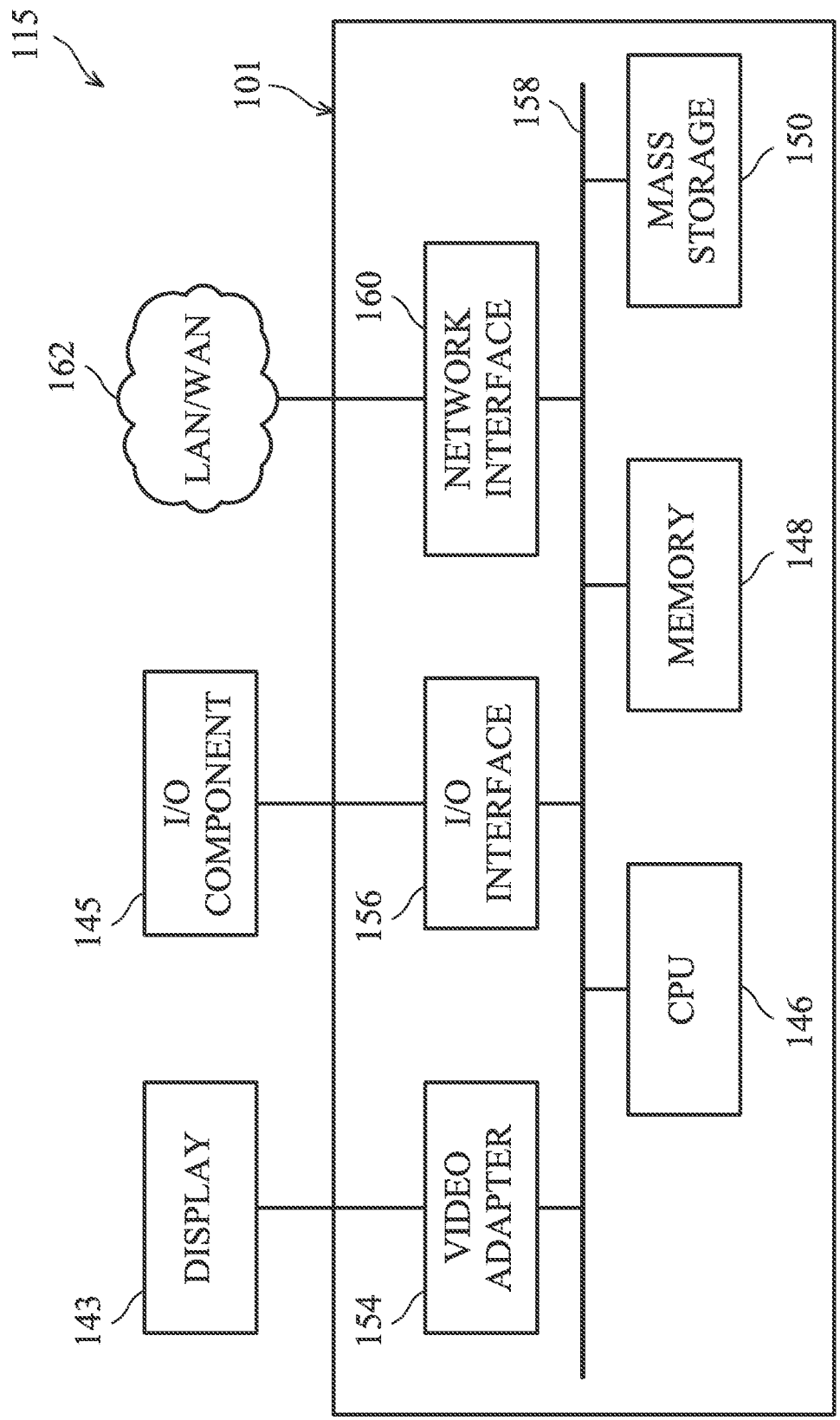

FIGS. 1A and 1B illustrate a deposition system 100 that may be utilized to deposit a material on a substrate 110, in accordance with some embodiments. The deposition system 100 may be utilized to deposit the material using a capillary-assisted atomic layer deposition process (ALD). An illustrative example of a capillary-assisted ALD process is described in greater detail in FIGS. 2 through 11. FIGS. 12 through 28 describe process steps for forming a FinFET device 310 using a capillary-assisted ALD process to deposit dielectric hard masks 380, in accordance with some embodiments.

Turning to FIGS. 1A-1B, a deposition system 100 is shown that may be utilized to deposit a material using a capillary-assisted atomic layer deposition process (ALD), such as that described in greater detail below for FIGS. 2-11. The deposition system 100 may be used to deposit a material on a substrate 110, which may be, for example, a semiconductor structure (e.g., structure 210 shown FIG. 2), a wafer (e.g., a part of the wafer is substrate 320 shown in FIG. 12), a device, a package, another structure, or the like.

In some embodiments, the deposition system 100 receives precursor materials from a first precursor delivery system 105 and a second precursor delivery system 106 and forms layers of materials onto the substrate 110. The first precursor delivery system 105 and the second precursor delivery system 106 may work in conjunction with one another to supply the various different precursor materials to a deposition chamber 103 within which the substrate 110 is placed. In some cases, the first precursor delivery system 105 and the second precursor delivery system 106 may have physical components that are similar with each other. For example, the first precursor delivery system 105 may include a gas supply 107A and a flow controller 109A, and the second precursor delivery system 106 may include a gas supply 107B and a flow controller 109B. In an embodiment in which a precursor is stored in a gaseous state, a gas supply 107A/B may supply the precursor to the deposition chamber 103. The gas supply 107A/B may be a vessel, such as a gas storage tank, that is located either locally to the deposition chamber 103 or else may be located remotely from the deposition chamber 103. In another embodiment, the gas supply 107A/B may be a facility that independently prepares and delivers the precursor to the respective flow controller 109A/B. Any suitable source for a precursor may be utilized as the gas supply 107A and/or 107B, and all such sources are fully intended to be included within the scope of the embodiments.

The gas supply 107A/B may supply the desired precursor to the respective flow controller 109A/B. The flow controller 109A/B may be utilized to control the flow of the precursor to the precursor gas controller 113 and, eventually, to the deposition chamber 103, thereby also helping to control the pressure within the deposition chamber 103. The flow controller 109A and/or 109B may be, e.g., a proportional valve, a modulating valve, a needle valve, a pressure regulator, a mass flow controller, combinations of these, or the like. However, any suitable method for controlling and regulating the flow of the gas to the precursor gas controller 113 may be utilized, and all such components and methods are fully intended to be included within the scope of the embodiments.

As one of ordinary skill in the art will recognize, while the first precursor delivery system 105 and the second precursor delivery system 106 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 100, may be utilized. All such precursor systems are fully intended to be included within the scope of the embodiments.

Additionally, in an embodiment in which a precursor is stored in a solid or liquid state, the gas supply 107A/B may store a carrier gas and the carrier gas may be introduced into a precursor canister (not separately illustrated), which stores the precursor in the solid or liquid state. The carrier gas is then used to push and carry the precursor as it evaporates or sublimates into a gaseous section of the precursor canister before being sent to the precursor gas controller 113. Any suitable method and combination of components may be utilized to provide the precursor, and all such combination of components are fully intended to be included within the scope of the embodiments.

The first precursor delivery system 105 and the second precursor delivery system 106 may supply their individual precursor materials into a precursor gas controller 113. The precursor gas controller 113 connects and isolates the first precursor delivery system 105 and the second precursor delivery system 106 from the deposition chamber 103 in order to deliver the desired precursor materials to the deposition chamber 103. The precursor gas controller 113 may include such devices as valves, flow meters, sensors, and the like to control the delivery rates (e.g., flow rates) of each of the precursors, and may be controlled by instructions received from the control unit 115 (described further below with respect to FIG. 1B).

The precursor gas controller 113, upon receiving instructions from the control unit 115, may open and close valves so as to connect one or more of the first precursor delivery system 105 and the second precursor delivery system 106 to the deposition chamber 103 and direct a desired precursor material through a manifold 116, into the deposition chamber 103, and to a showerhead 117. The showerhead 117 may be utilized to disperse the chosen precursor material(s) into the deposition chamber 103 and may be designed to evenly disperse the precursor material in order to minimize undesired process conditions that may arise from uneven dispersal. In an embodiment the showerhead 117 may have a circular design with openings dispersed evenly around the showerhead 117 to allow for the dispersal of the desired precursor material into the deposition chamber 103.

However, as one of ordinary skill in the art will recognize, the introduction of precursor materials to the deposition chamber 103 through a single showerhead 117 or through a single point of introduction as described above is intended to be illustrative only and is not intended to be limiting to the embodiments. Any number of separate and independent showerheads 117 or other openings to introduce precursor materials into the deposition chamber 103 may be utilized. All such combinations of showerheads and other points of introduction are fully intended to be included within the scope of the embodiments.

The deposition chamber 103 may receive the desired precursor materials and expose the substrate 110 to the precursor materials, and the deposition chamber 103 may be any desired shape that may be suitable for dispersing the precursor materials and contacting the precursor materials with the substrate 110. In the embodiment illustrated in FIG. 1A, the deposition chamber 103 has a cylindrical sidewall and a bottom. However, the deposition chamber 103 is not limited to a cylindrical shape, and any other suitable shape, such as a hollow square tube, an octagonal shape, or the like, may be utilized. Furthermore, the deposition chamber 103 may be surrounded by a housing 119 made of material that is inert to the various process materials. As such, while the housing 119 may be any suitable material that can withstand the chemistries and pressures involved in the deposition process, in an embodiment the housing 119 may be steel, stainless steel, nickel, aluminum, alloys of these, combinations of these, and like.

Within the deposition chamber 103 the substrate 110 may be placed on a mounting platform 121 in order to position and control the substrate 110 during the deposition processes. The mounting platform 121 may include heating mechanisms in order to heat the substrate 110 during the deposition processes. For example, the mounting platform 121 may be heated during a thermal ALD process.

In some embodiments, a precursor material may be ignited into a plasma in order to assist in the deposition process, such as for a plasma ALD process. In this embodiment, the mounting platform 121 may additionally comprise a first electrode 123 coupled to a first RF generator 133. The first electrode 123 may be electrically biased by the first RF generator 133 (under control of the control unit 115) at a RF voltage during the deposition process. By being electrically biased, the first electrode 123 is used to provide a bias to the incoming second precursor material as well as assist to ignite the precursor material into a plasma. Additionally, the first electrode 123 is also utilized to maintain the precursor plasma during the deposition process by maintaining the bias.

In an embodiment, the showerhead 117 may also be or comprise (or otherwise incorporate) a second electrode 129 for use as a plasma generator to assist in the deposition chamber 103. In an embodiment the plasma generator may be a transformer coupled plasma generator and may be, e.g., a coil. The coil may be attached to a second RF generator 127 that is utilized to provide power to the second electrode 129 (under control of the control unit 115) in order to ignite the plasma during introduction of the precursor material.

However, while the second electrode 129 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

Furthermore, while a single mounting platform 121 is illustrated in FIG. 1A, any number of mounting platforms 121 may additionally be included within the deposition chamber 103. Additionally, the deposition chamber 103 and the mounting platform 121 may be part of a cluster tool system (not shown). The cluster tool system may be used in conjunction with an automated handling system in order to position and place the substrate 110 into the deposition chamber 103 prior to the deposition processes, position, hold the substrate 110 during the deposition processes, and remove the substrate 110 from the deposition chamber 103 after the deposition processes.

The deposition chamber 103 may also have an exhaust outlet 125 for exhaust gases to exit the deposition chamber 103. A vacuum pump 131 may be connected to the exhaust outlet 125 of the deposition chamber 103 in order to help evacuate the exhaust gases. The vacuum pump 131, under control of the control unit 115, may also be utilized to reduce and control the pressure within the deposition chamber 103 to a desired pressure and may also be utilized to evacuate precursor materials from the deposition chamber 103 in preparation for the introduction of the next precursor material.

FIG. 1B illustrates an embodiment of the control unit 115 that may be utilized to control the precursor gas controller 113 and the vacuum pump 131 (as illustrated in FIG. 1A). The control unit 115 may be any form of computer processor that can be used in an industrial setting for controlling process machines. In an embodiment the control unit 115 may comprise a processing unit 101, such as a desktop computer, a workstation, a laptop computer, or a dedicated unit customized for a particular application. The control unit 115 may be equipped with a display 143 and one or more input/output components 145, such as instruction outputs, sensor inputs, a mouse, a keyboard, printer, combinations of these, or the like. The processing unit 101 may include a central processing unit (CPU) 146, memory 148, a mass storage device 150, a video adapter 154, and an I/O interface 156 connected to a bus 158.

The bus 158 may be one or more of any type of several bus architectures including a memory bus or memory controller, a peripheral bus, or video bus. The CPU 146 may comprise any type of electronic data processor, and the memory 148 may comprise any type of system memory, such as static random access memory (SRAM), dynamic random access memory (DRAM), or read-only memory (ROM). The mass storage device 150 may comprise any type of storage device configured to store data, programs, and other information and to make the data, programs, and other information accessible via the bus 158. The mass storage device 150 may comprise, for example, one or more of a hard disk drive, a magnetic disk drive, or an optical disk drive.

The video adapter 154 and the I/O interface 156 provide interfaces to couple external input and output devices to the processing unit 101. As illustrated in FIG. 1B, examples of input and output devices include the display 143 coupled to the video adapter 154 and the I/O component 145, such as a mouse, keyboard, printer, and the like, coupled to the I/O interface 156. Other devices may be coupled to the processing unit 101, and additional or fewer interface cards may be utilized. For example, a serial interface card (not shown) may be used to provide a serial interface for a printer. The processing unit 101 also may include a network interface 160 that may be a wired link to a local area network (LAN) or a wide area network (WAN) 162 and/or a wireless link.

It should be noted that the control unit 115 may include other components. For example, the control unit 115 may include power supplies, cables, a motherboard, removable storage media, cases, and the like. These other components, although not shown in FIG. 1B, are considered part of the control unit 115.

Turning now to FIGS. 2-11, intermediate steps in an example capillary-assisted ALD process is shown, in accordance with some embodiments. The capillary-assisted ALD process described herein may be used, for example, to deposit a gap-filling material within narrow regions of a structure with a reduced chance of forming seams or voids. The process shown is an illustrative example in which a deposition system (e.g., the deposition system 100 or the like) is used to perform a capillary-assisted ALD process that deposits a material 240 over a structure 210. For example, the substrate 110 described previously for FIG. 1A may comprise the structure 210. The capillary-assisted ALD process includes an ALD process in which at least one precursor of the material 240 exhibits capillarity on surfaces of the structure 210. The example capillary-assisted ALD process of FIGS. 2-11 describes a process in which a first precursor 220 does not exhibit capillarity and a second precursor 230 does exhibit capillarity, but in other embodiments both precursors may exhibit capillarity, or precursors used at different steps in the process may exhibit capillarity. In some embodiments, the conditions of the deposition process may be controlled to enhance the capillarity of one or more precursors to improve the quality or gap-filling capability of the deposited material 240. The specific characteristics of the precursors used may depend on the material 240. The capillary-assisted ALD process is described below with reference to the ALD cycle diagram 250 shown in FIG. 11, which shows an example single ALD cycle that comprises two steps.

Figure 2:
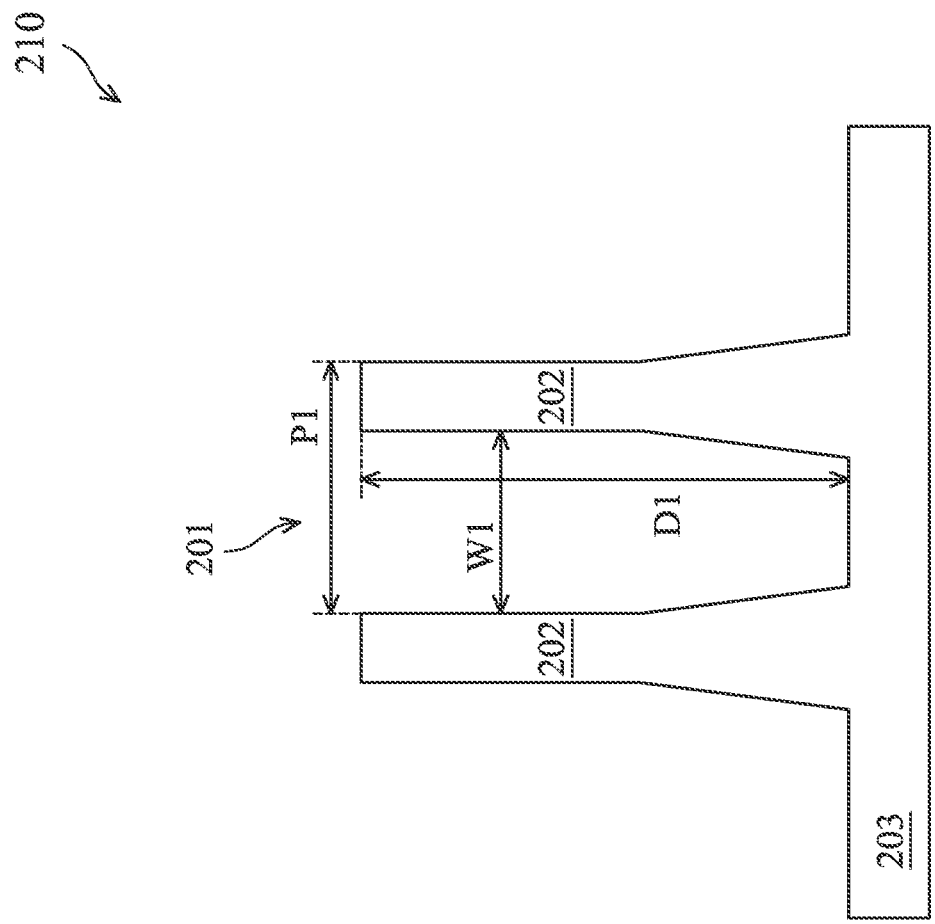
FIGS. 2, 3, 4, 5, 6, 7, 8, 9, and 10 are cross-sectional views of intermediate stages in the performing of a capillary-assisted deposition ALD process, in accordance with some embodiments.

Turning to FIG. 2, a structure 210 is shown, in accordance with some embodiments. The structure 210 includes two features 202 protruding from a substrate 203 in which the features 202 are separated by a trench 201. The structure 210 shown is an example, and the techniques described herein may be used to deposit a material over any suitable structure or within any suitable trench or recess. As another example, FIGS. 23-24 describe an embodiment in which a dielectric hard mask material 380' is deposited within a recess 378 as part of forming a FinFET device 310. These and other structures are considered within the scope of the present disclosure.

The trench 201 shown in FIG. 2 has a width W1 that may be, for example, in a range between about 3 nm and about 30 nm, though other widths are possible. The trench 201 may have a depth D1 in a range between about 9 nm and about 300 nm, though other depths are possible. As such, the trench 201 may have height:width aspect ratio that is in a range between about 1:2 and about 1:25, though other aspect ratios are possible. The features 202 may have a pitch P1 that is in a range between about 5 nm and about 200 nm, though other pitches are possible. In some cases, a capillary-assisted ALD process such as described herein can deposit a material into trenches, recesses, or the like having a width W1 less than about 10 nm, a depth greater than about 100 nm, or an aspect ratio greater than about 1:10 without the formation of seams or voids in the deposited material. This can improve yield and improve process reliability when using an ALD process to deposit a material.

Figure 3:
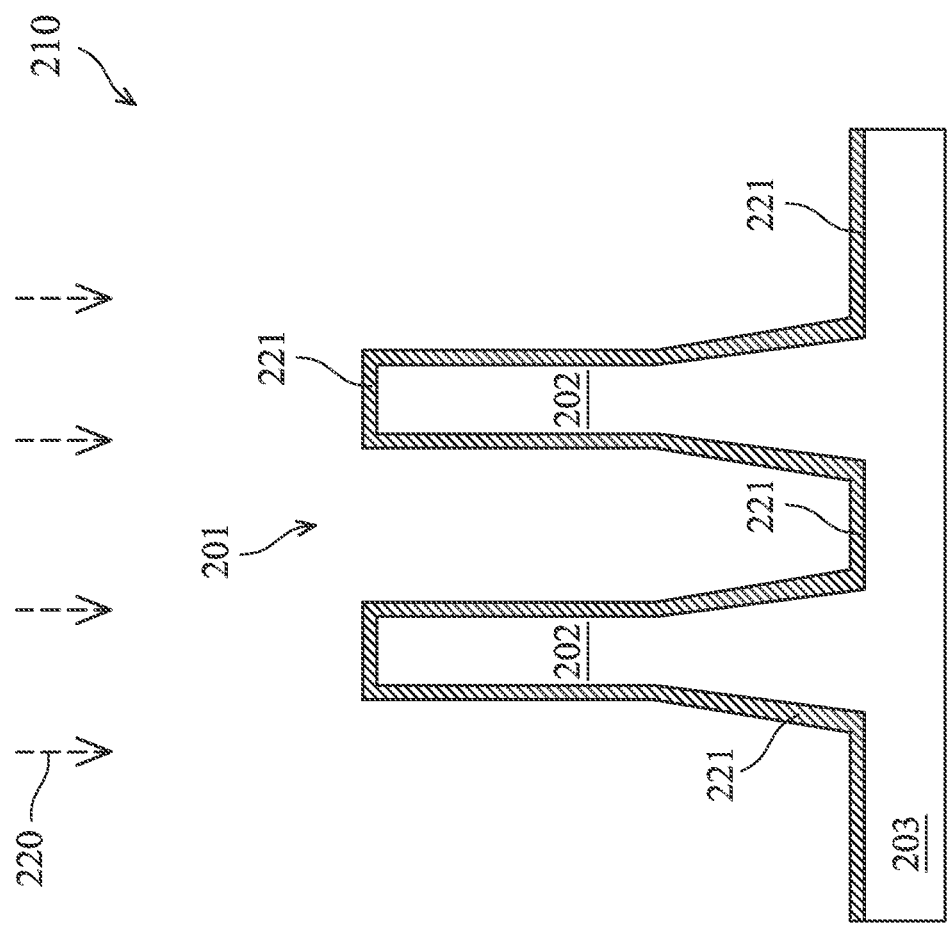

Turning to FIG. 3, a first precursor material 220 may be flowed (e.g., "pulsed") into the deposition chamber (e.g., deposition chamber 103). This corresponds to first precursor flow 252A of Step 1 shown in FIG. 11. In this example process, the first precursor material 220 does not exhibit capillarity. The first precursor material 220 adsorbs on and reacts with exposed surfaces of the structure 210, forming a first reaction product 221 that is bonded to those surfaces. Once the first precursor material 220 has reacted with all available reaction sites on the surfaces, no further first reaction product 221 can be formed. In this manner, the formation of the first reaction product 221 may be a "self-limiting reaction."

After the first precursor material 220 has reacted, the deposition chamber may then be purged of excess first precursor material 220 or other reaction products. This corresponds to first purge 252B of Step 1 shown in FIG. 11. The purging may be performed before or after the self-limiting reaction that forms the first reaction product 221 is finished. The purging may be performed, for example, by flowing a purge gas such as nitrogen, argon, xenon, or the like into the deposition chamber. After performing first purge 252B, Step 1 of the ALD cycle is complete.

Figure 4:
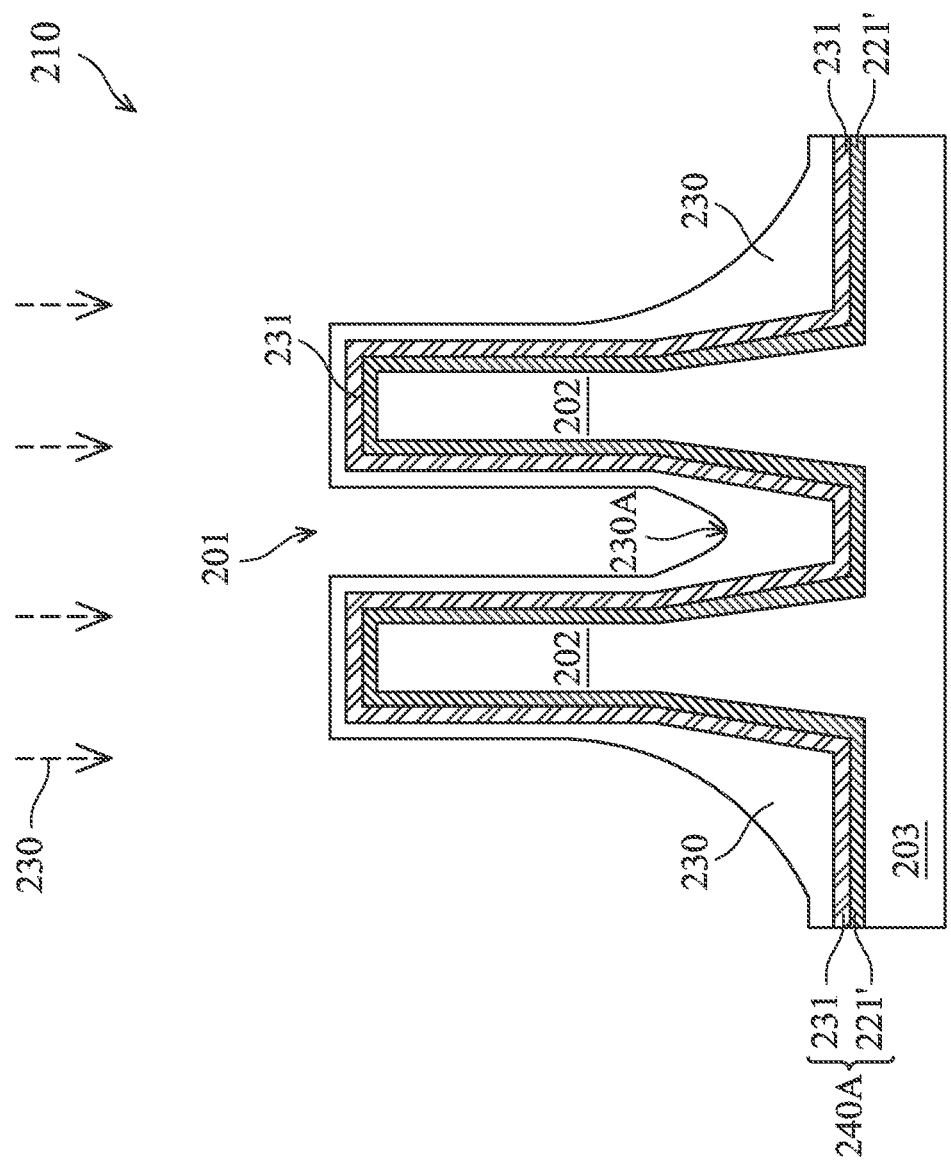

Turning to FIG. 4, a second precursor material 230 may then be flowed into the deposition chamber. This corresponds to second precursor flow 254A of Step 2 shown in FIG. 11. In this example process, the second precursor material 230 does exhibit capillarity. The second precursor material 230 adsorbs on and reacts with the first reaction product 221, forming a second reaction product 231 that is bonded to the first reaction product 221. It should be noted that the first reaction product 221 may undergo chemical changes during the reaction with the second precursor material 230, and the first reaction product 221 after reaction with the second precursor material 230 is thus labeled as first reaction product 221' in FIG. 4. The result of the reaction between the first reaction product 221 and the second precursor material 230 forms some or all of one layer (e.g., a monolayer) of material 240, labeled as material layer 240A in FIG. 4. The formation of a monolayer of material 240 may also be a self-limiting reaction, as the reaction is limited by the number of unreacted sites of the first reaction product 221.

Additionally, FIG. 4 shows an embodiment in which the process conditions (e.g., pressure and/or temperature) of the deposition are controlled and/or the second precursor material 230 is chosen such that the second precursor material 230 that condenses over the structure 210 experiences capillary forces. For example, the second precursor material 230 may be chosen to be a material that has capillarity in a liquid phase (referred to herein as "capillary liquid"). Some example precursors having capillarity are described below. In some embodiments, the pressure and/or temperature of the deposition chamber may be controlled to promote condensation or adsorption of the second precursor material 230 onto surfaces (e.g., on the reaction product 221) as a liquid. Some example process conditions are also described below. In some embodiments, a higher pressure and/or a lower temperature within the deposition chamber may promote condensation of the second precursor material 230 on surfaces. The pressures and/or temperatures used during the process may depend on the properties (e.g., melting point, boiling point, etc.) of the second precursor material 230. For example, a precursor having a higher melting point may condense at lower temperatures than a precursor having a lower melting point, or a precursor having a lower boiling point may condense at higher temperatures than a precursor having a higher boiling point.

As shown in FIG. 4, second precursor material 230 introduced into the deposition chamber may condense on surfaces as a liquid. Being a capillary liquid, this second precursor material 230 in liquid phase may be drawn toward surfaces by capillary forces. In particular, the second precursor material 230 in liquid phase may be drawn into a recess by capillary forces from the sidewalls surrounding the recess. For example, the second precursor material 230 in liquid phase may be drawn toward the bottom of the trench 201 by the capillary forces from the sidewalls of the features 202 and the bottom surface of the substrate 203. In this manner, a capillary liquid precursor can be formed on some surfaces within narrow or confined regions more easily than, for example, a precursor present in a gas phase. This can facilitate the growth of the desired material on surfaces that may be difficult for a gaseous precursor to reach, such as surfaces near the bottom of a trenches, surfaces within recesses having a high aspect ratio, surfaces within deep openings, or the like. The capillary action allows the second precursor material 230 to react with first reaction product 221 on these surfaces to form the material 240. In this manner, the capillary action of a precursor during an ALD process can facilitate the growth of material from the bottom of a trench as well as from the sidewalls of the trench. This can allow the material to be grown in a trench without the formation of seams or voids.

Additionally, second precursor material 230 that condenses on upper surfaces or top surfaces of the structure 210 can react with the first reaction product 221 to form the material 240 on those surfaces. In this manner, the material 240 may be conformally deposited on the upper surfaces or top surfaces of a structure in addition to surfaces within trenches. As such, the use of a capillary-assisted ALD as described herein can form a desired material over all surfaces of a structure, and form the material with less chance of incomplete coverage of surfaces. In some cases, condensation of the second precursor material 230 in relatively confined regions, such as near the bottom of the trench 201, may be facilitated due to capillary condensation effects, in which liquids may be more likely to condense in regions that are near relatively more surfaces.

As shown in FIG. 4, due to capillary action, the second precursor material 230 in liquid phase collects near the bottom of the trench 201. This relatively large quantity of liquid second precursor material 230 due to capillary action is indicated in FIG. 4 as liquid second precursor material 230A. A meniscus or capillary bridge extending between the features 202 formed of the liquid second precursor material 230A may be formed near the bottom of the trench 201. The meniscus or bridge may have a concave surface as shown in FIG. 4, or may have a flat surface or a convex surface.

After the second precursor material 230 has reacted to form the material 240, the deposition chamber may then be purged of excess second precursor material 230 or other reaction products. This corresponds to second purge 254B of Step 2 shown in FIG. 11. The purging may be performed before or after the self-limiting reaction that forms a monolayer of material 240 is finished. The purging may be performed, for example, by flowing a purge gas such as nitrogen, argon, xenon, or the like into the deposition chamber.

Figure 5:
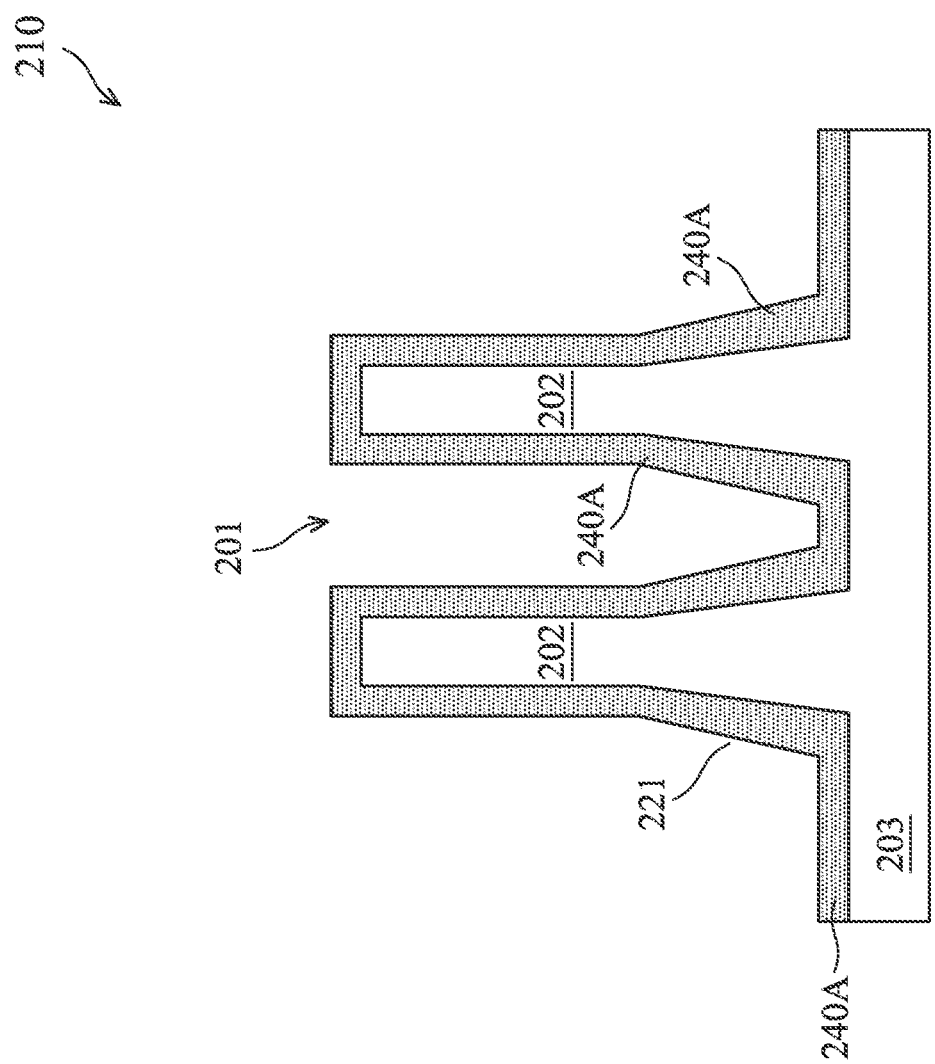
Figure 6:
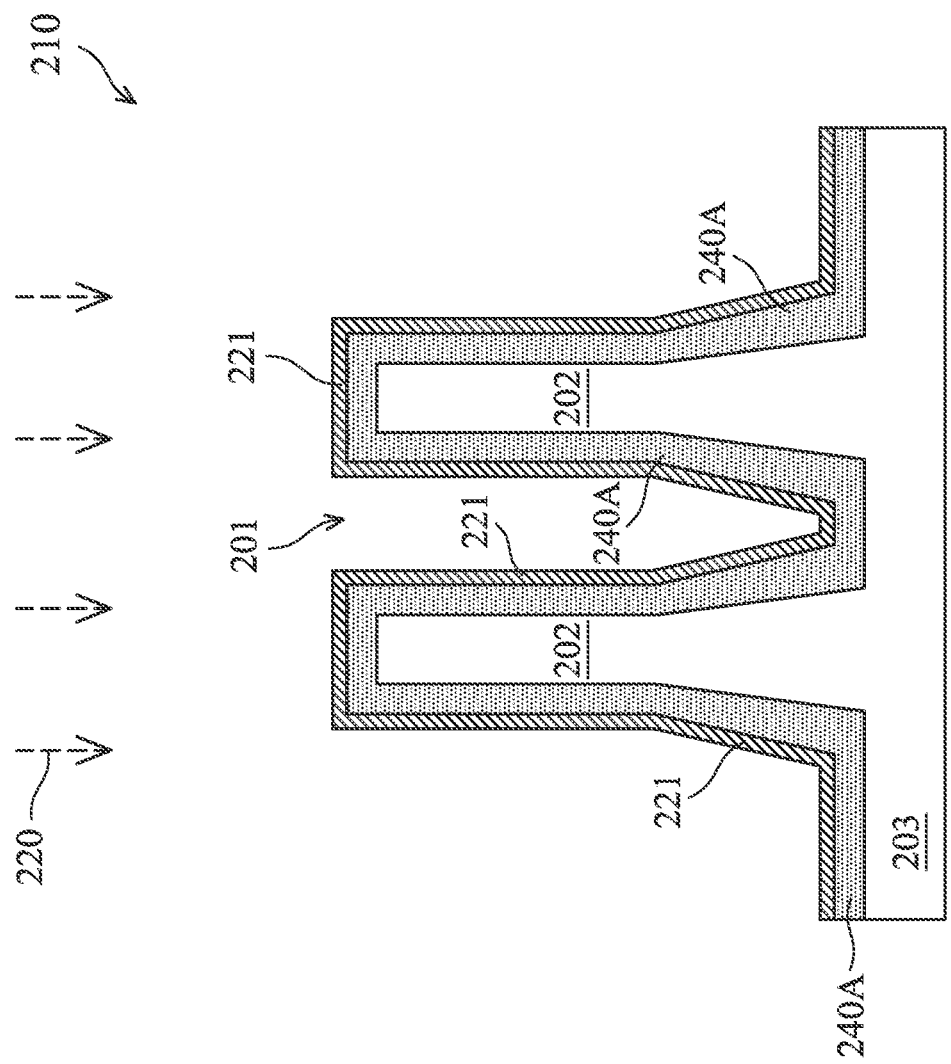
Figure 7:
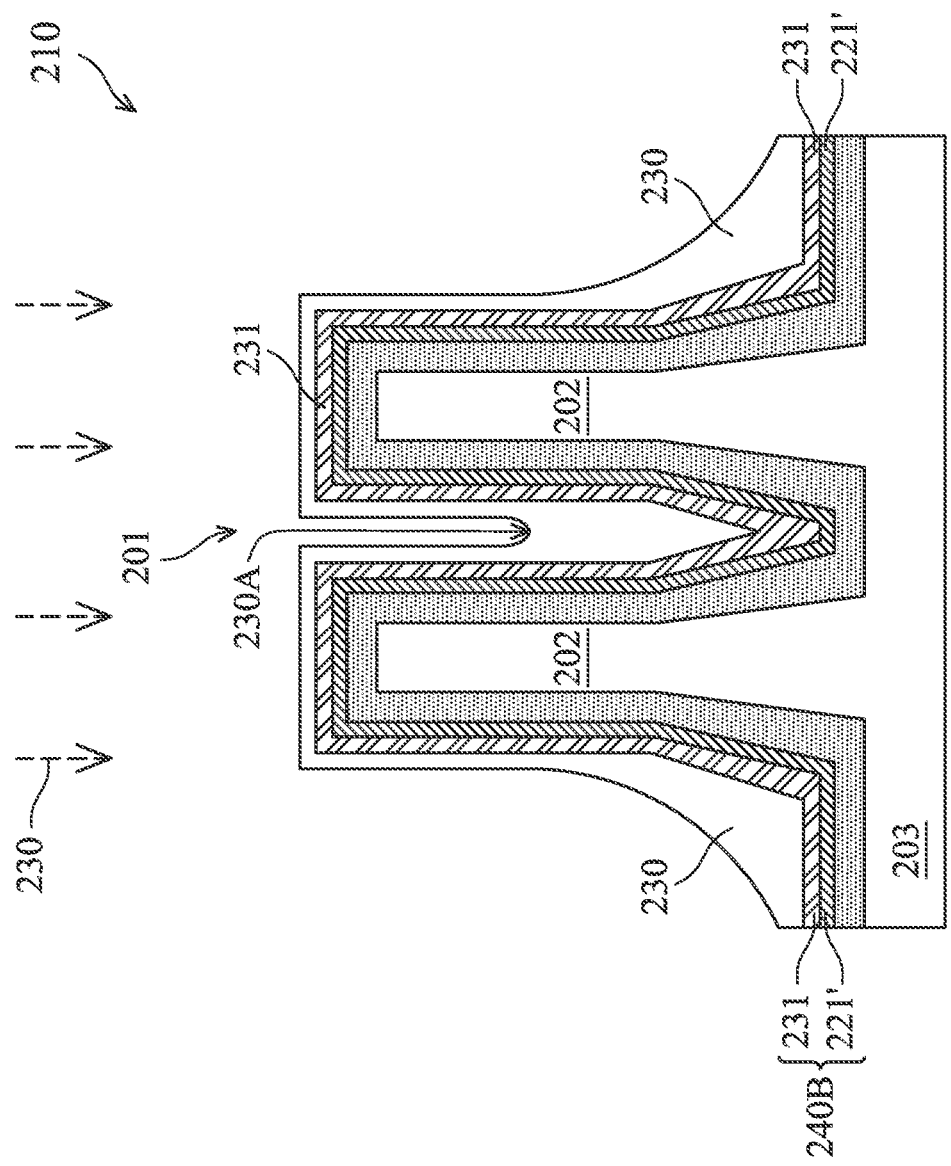

After the deposition chamber has been purged at second purge 254B, Step 2 of the ALD cycle is completed, and the entire ALD cycle for the formation of the material 240 has been completed. The resulting layer of material 240 is shown in FIG. 5 as material layer 240A. The ALD cycle described for FIGS. 2-4 and 11 may then be repeated until a desired thickness of material 240 has been formed or until sufficient gap-filling (e.g., of the trench 201) has been achieved. For example, FIG. 6 shows the introduction of first precursor material 220 into the deposition chamber, where it reacts with the material layer 240A to form first reaction product 221, corresponding to first precursor flow 252A. The first purge 252B may then be performed. In FIG. 7, the second precursor 230 is introduced into the deposition chamber, where it condenses on surfaces and reacts with the first reaction product 221 to form another layer of material 240, indicated in FIG. 7 as material layer 240B.

Figure 8:
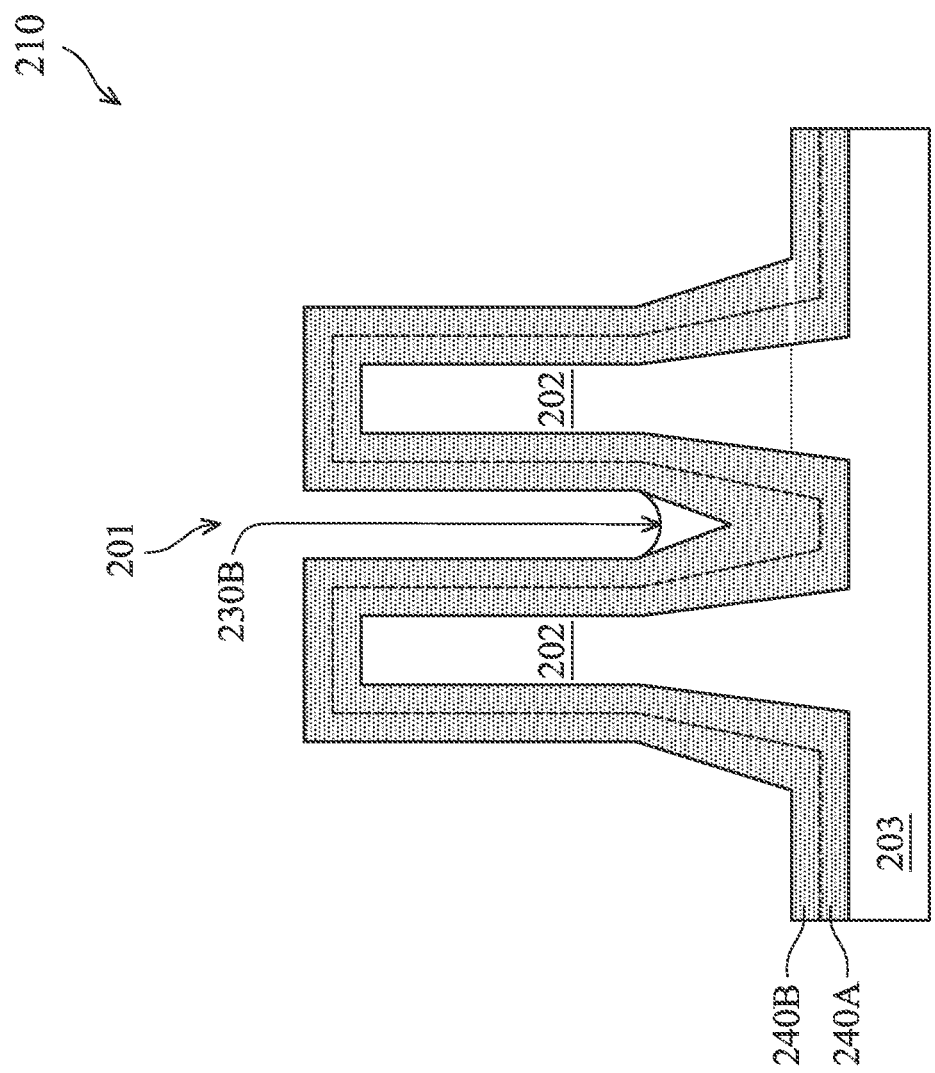
Figure 9:
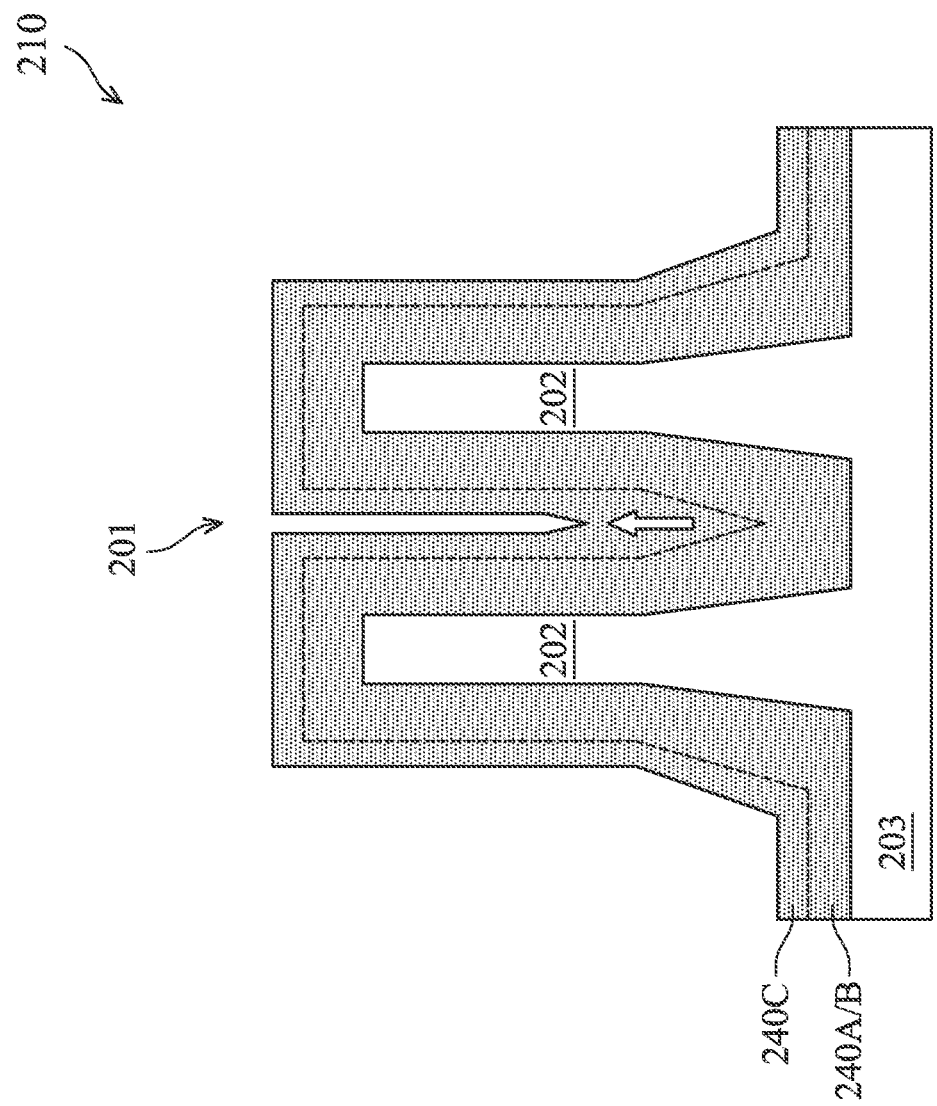

FIGS. 8-9 shows an embodiment in which the second purge 254B after forming the material layer 240B incompletely removes the unreacted second precursor material 230 from the deposition chamber, in accordance with some embodiments. A purge may be controlled to be an incomplete purge by, for example, reducing the rate or duration of the flow of purge gases. Additionally, the pressure and/or temperature of the deposition chamber may be controlled to maintain the presence of condensed precursor material. As an illustrative example, a capillary-assisted ALD process using an incomplete purge is shown in the context of occurring after FIG. 7, but the technique may be utilized with any other embodiments, processes, or techniques for a capillary-assisted ALD process such as those described herein. In some embodiments, one or more incomplete purges are performed in each ALD cycle, but in other embodiments, all purges are complete or nearly complete.

Referring to FIG. 8, an incomplete second purge 254B after second precursor flow 254A can leave a remaining portion of the second precursor material 230 in liquid phase, shown in FIG. 8 as remaining liquid 230B. The remaining liquid 230 may preferentially remain in relatively narrow or confined regions, such as near the bottom of trench 201, due to capillary forces. In some cases, a remaining liquid 230 may be present during a subsequent first precursor flow 252A. The first precursor material 220 may react with the second precursor material 230 in the remaining liquid 230B and form more than one monolayer of material 240 in these regions due to the presence of the additional second precursor material 230 in the remaining liquid 230B being available to react with first reaction product 221. In this manner, the growth of the material 240 may be greater in regions where remaining liquid 230B is present, such as near the bottom of trench 201. Thus, during a single ALD cycle, the material 240 formed in the trench 201 may grow faster in a "bottom-up" direction from the bottom of the trench 201 than from the sidewalls of the trench 201. This is shown in FIG. 9, in which a subsequently formed material layer 240C is thicker near the bottom of the trench 201 than on the sidewalls of the trench 201. Growth of the material 240 in a "bottom-up" direction such as this can improve gap-filling of narrow or high aspect ratio recesses and also can reduce the chance of seams or voids forming within the material 240 during growth.

Figure 10:
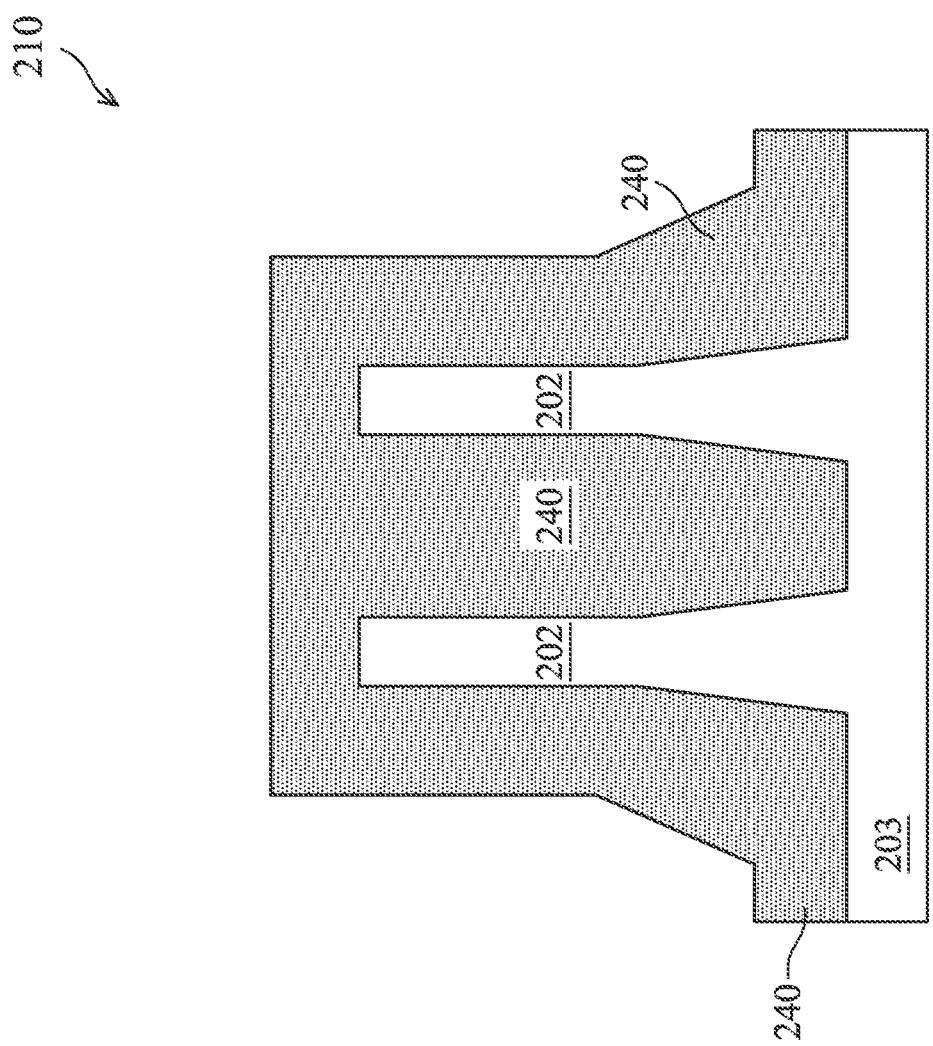
Figure 11:
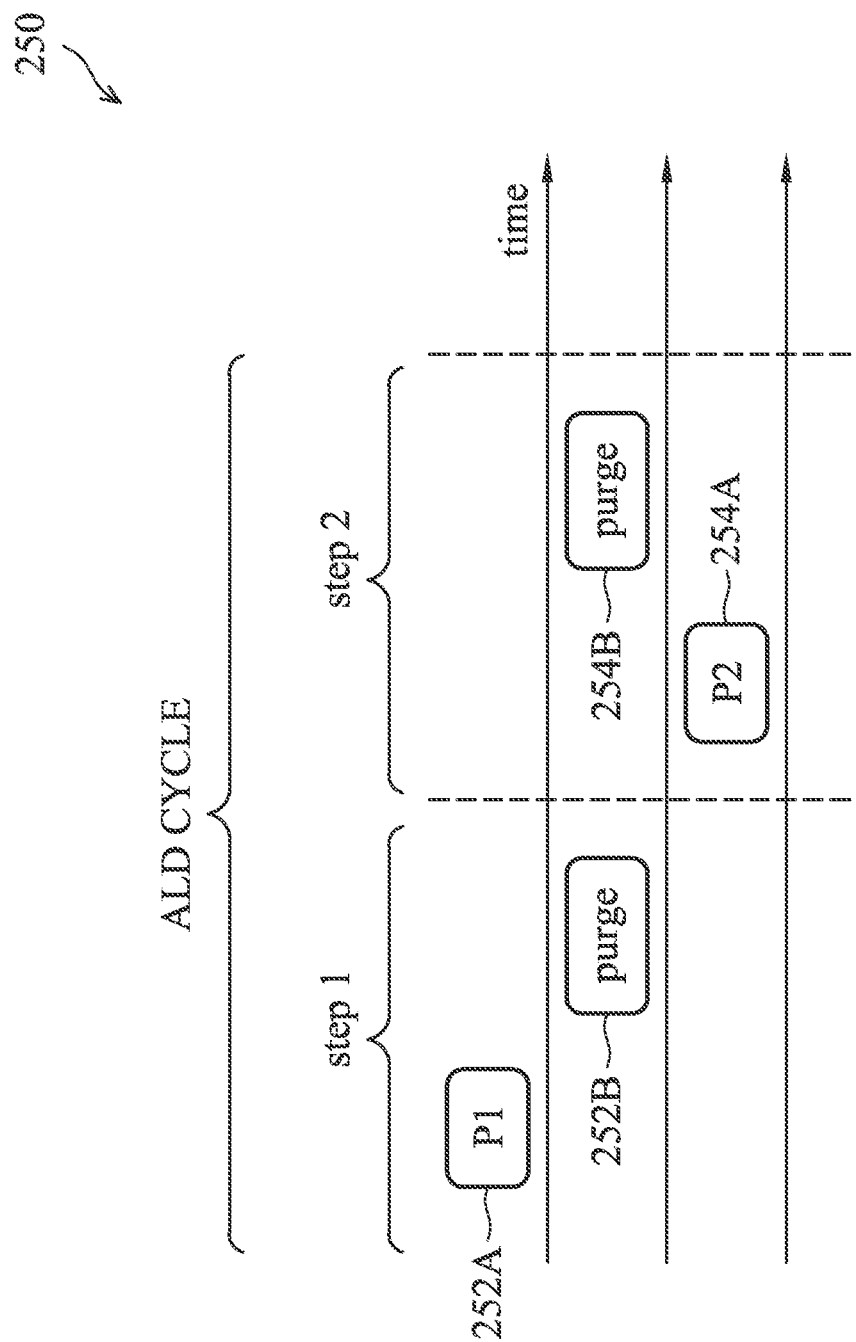
FIG. 11 is an illustration of an ALD cycle of a capillary-assisted deposition ALD process, in accordance with some embodiments.

FIG. 10 shows the structure 210 after multiple ALD cycles have completely filled the trench 201 with the material 240, in accordance with some embodiments. As stated previously, the capillary-assisted ALD process described herein can be used as a seam-free gap-filling deposition process. Additionally, the capillary-assisted ALD process described herein can also preserves conformal deposition on upper surfaces and top corners of structures, which allows for improved deposition of material, for example, in partial gap-filling process steps.

In some embodiments, the capillary-assisted ALD process described herein may be used to deposit a material (e.g. material 240) that comprises a dielectric material such as a nitride, an oxide, a metal oxide or the like. One or more of the precursors of the material may be chosen to be a capillary liquid to facilitate growth within narrow or high aspect ratio trenches. For example, in some embodiments, one of the precursors of the material may be water ($H_2O$), which exhibits capillarity in a liquid phase. In some embodiments, a specific precursor may be chosen to have a higher boiling point and/or a lower melting point than other precursors, which can allow that precursor to condense at lower temperatures. For example, a precursor with a longer carbon chain may have a higher boiling point than a similar precursor with a shorter carbon chain. Example precursors that include carbon chains include, trimethylaluminum $Al(CH_3)_3$ (also referred to as "TMA"), diethylzinc $(C_2H_5)_2Zn$, $H_2Si[N(C_2H_5)_2]_2$, tris(dimethylamino)silane $(Me_2N)_3SiH$, or various other suitable precursors.

As an example, the capillary-assisted ALD process described herein may be used to deposit aluminum oxide ($Al_2O_3$), which may be formed using TMA and water (e.g., water vapor) as precursors. For example, the material 240 may be formed of aluminum oxide deposited using TMA as the first precursor material 220 and water as the second precursor material 230. In some embodiments in which the deposited material is aluminum oxide, TMA may be flowed into the deposition chamber at a flow rate of between about 50 sccm and about 300 sccm, with a carrier gas flow rate of between about 50 sccm and about 1000 sccm. The TMA may be flowed for a time of between about 0.1 seconds and about 10 seconds. Additionally, during the flowing of TMA, the deposition chamber may be held at a pressure of between about 0.5 Torr and about 50 Torr, and at a temperature of between about 30° C. and about 300° C. In some embodiments, water may be flowed into the deposition chamber at a flow rate of between about 50 sccm and about 600 sccm, with a carrier gas flow rate of between about 50 sccm and about 1000 sccm. The water may be flowed for a time of between about 0.1 seconds and about 10 seconds. Additionally, during the flowing of water, the deposition chamber may be held at a pressure of between about 0.5 Torr and about 50 Torr, and at a temperature of between about 30° C. and about 300° C. The use of these temperatures and/or pressures can allow the water introduced into the deposition chamber to condense on surfaces, as described for FIG. 4.

In other embodiments, a material deposited using the capillary-assisted ALD process may be another material for which water is used as a precursor. For example, the capillary-assisted ALD process may deposit a material such as lanthanum oxide ($La_2O_3$) formed using $La(iPrCp)_2(iPr-amd)$ and water as precursors, hafnium oxide ($HfO_2$) formed using $HfCl_4$ and/or $CpHf(NMe_2)_3$ and water as precursors, or zirconium oxide ($ZrO_2$) formed using $ZrCl_4$ and/or $CpZr(NMe_2)_3$ and water as precursors. In some embodiments, these or other precursors may be used at a process pressure of between about 0.5 Torr and about 6 Torr or at a process temperature of between about 250° C. and about 350° C., though other process conditions may be used. Other materials, precursors, or process conditions are possible.

Other materials may be formed by the capillary-assisted ALD process from other precursors, such as SiN formed using $SiH_2Cl_2$ and/or $SiH_2I_2$ and $NH_3$ as precursors. In some cases, the $NH_3$ exhibits capillarity in a liquid phase. In some embodiments, these or other precursors may be used at a process pressure of between about 0.5 Torr and about 6 Torr, at a process temperature of between about 150° C. and about 600° C., or at a precursor flow of between about 10 sccm and about 2000 sccm, though other process conditions may be used. The capillary-assisted ALD process may include a thermal ALD processes and/or a plasma ALD processes. As one of ordinary skill in the art will recognize, these materials, precursors, and process conditions are only intended to be illustrative, as any suitable precursors or process conditions may be utilized for depositing a material using a capillary-assisted ALD process while remaining within the scope of the embodiments.

FIGS. 12 through 28 illustrate intermediate stages in the process of forming a FinFET device 310 using a capillary-assisted ALD process such as described herein, in accordance with some embodiments. In particular, FIGS. 12-28 describe an embodiment in which a dielectric hard mask material 380' is deposited within a recess 378 using a capillary-assisted ALD process as part of forming the FinFET device 310.

Figure 12:
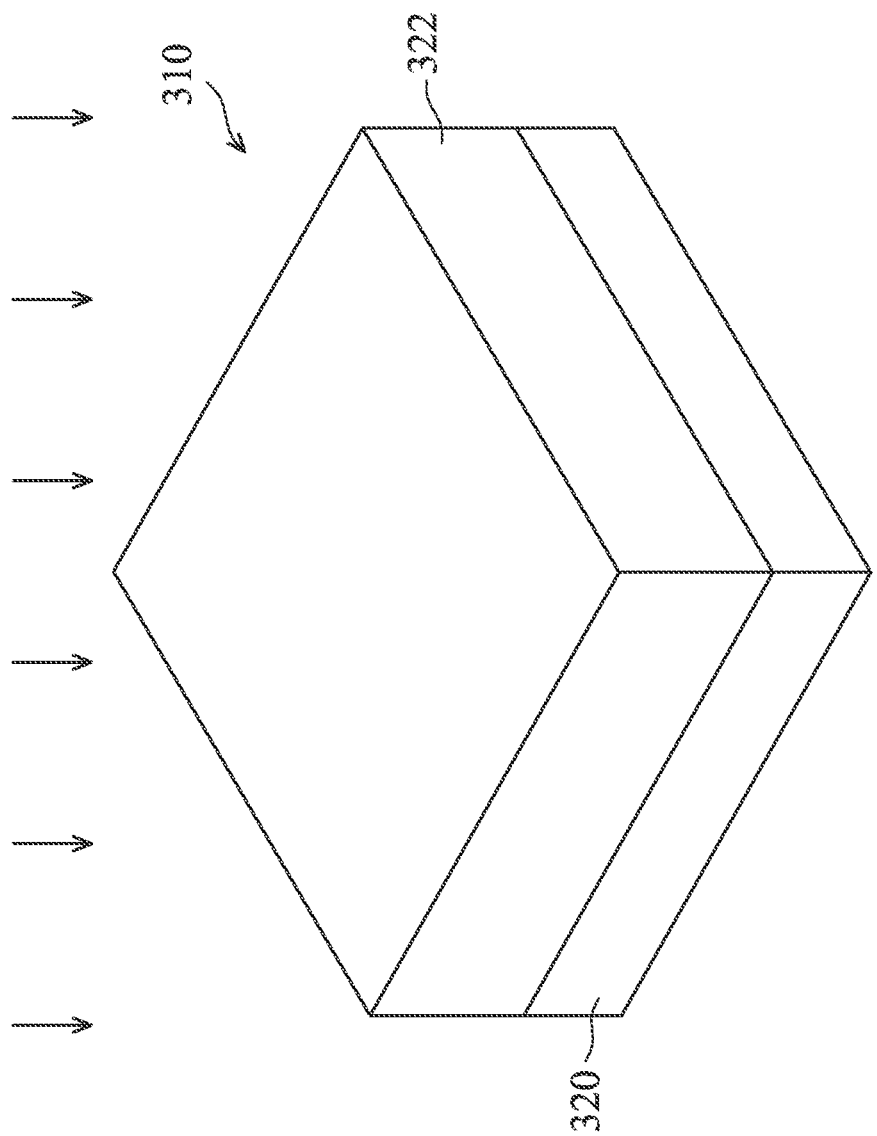
FIGS. 12, 13, 14, 15, 16, 17, 18, 19, 20, 21, 22, 23, 24, 25, 26, 27, and 28 are various views of intermediate stages in the manufacturing of FinFETs, in accordance with some embodiments.

In FIG. 12, substrate 320 is provided. The substrate 320 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 320 may be a part of wafer, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 320 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 12, well region 322 is formed in substrate 320. In accordance with some embodiments of the present disclosure, well region 322 is an n-type well region formed through implanting an n-type impurity, which may be phosphorus, arsenic, antimony, or the like, into substrate 320. In accordance with other embodiments of the present disclosure, well region 322 is a p-type well region formed through implanting a p-type impurity, which may be boron, indium, or the like, into substrate 320. The resulting well region 322 may extend to the top surface of substrate 320. The n-type or p-type impurity concentration may be equal to or less than $10^{18}$ $cm^{-3}$, such as in the range between about $10^{17}$ $cm^{-3}$ and about $10^{18}$ $cm^{-3}$.

Figure 13:
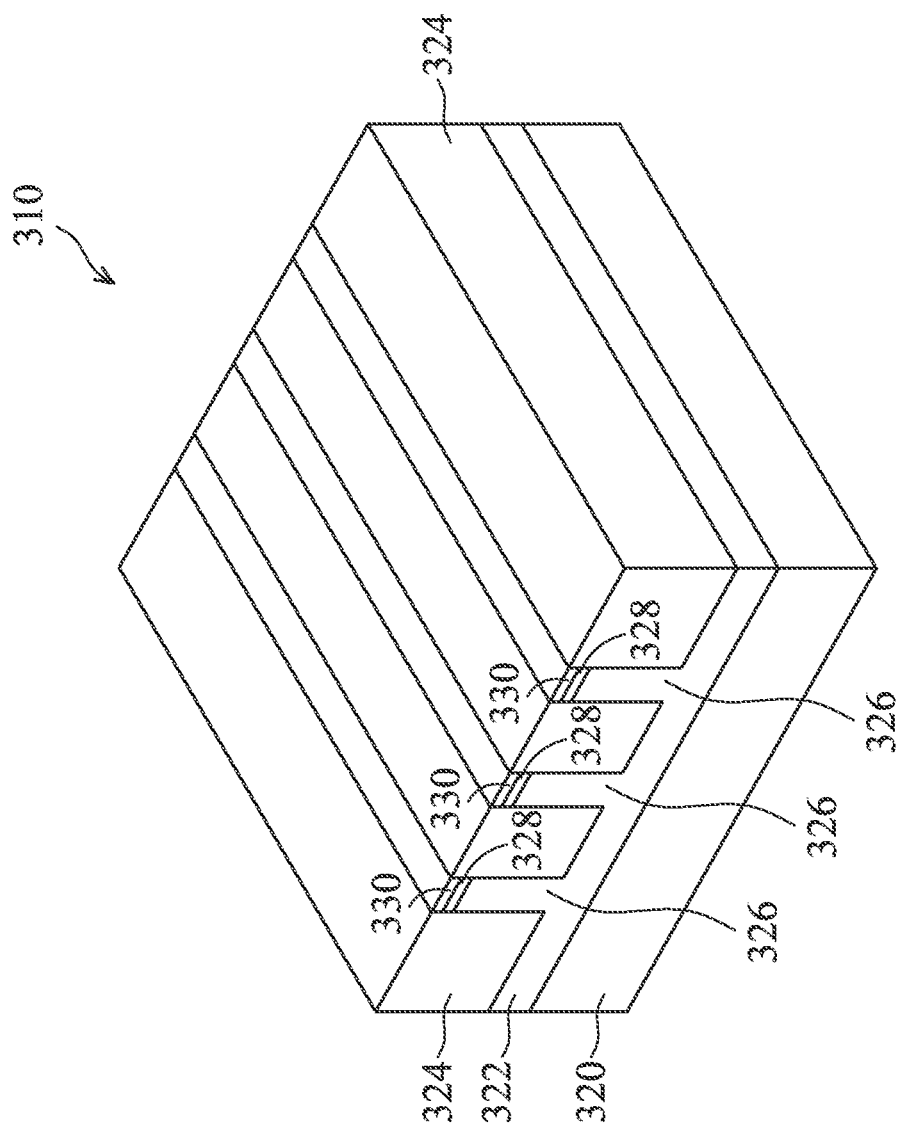

Referring to FIG. 13, isolation regions 324 are formed to extend from a top surface of substrate 320 into substrate 320. Isolation regions 324 are alternatively referred to as Shallow Trench Isolation (STI) regions hereinafter. The portions of substrate 320 between neighboring STI regions 324 are referred to as semiconductor strips 326. To form STI regions 324, pad oxide layer 328 and hard mask layer 330 are formed on semiconductor substrate 320, and are then patterned. Pad oxide layer 328 may be a thin film formed of silicon oxide. In accordance with some embodiments of the present disclosure, pad oxide layer 328 is formed in a thermal oxidation process, wherein a top surface layer of semiconductor substrate 320 is oxidized. Pad oxide layer 328 acts as an adhesion layer between semiconductor substrate 320 and hard mask layer 330. Pad oxide layer 328 may also act as an etch stop layer for etching hard mask layer 330. In accordance with some embodiments of the present disclosure, hard mask layer 330 is formed of silicon nitride, for example, using Low-Pressure Chemical Vapor Deposition (LPCVD). In accordance with other embodiments of the present disclosure, hard mask layer 330 is formed by thermal nitridation of silicon, or Plasma Enhanced Chemical Vapor Deposition (PECVD). A photo resist (not shown) is formed on hard mask layer 330 and is then patterned. Hard mask layer 330 is then patterned using the patterned photo resist as an etching mask to form hard masks 330 as shown in FIG. 13.

Next, the patterned hard mask layer 330 is used as an etching mask to etch pad oxide layer 328 and substrate 320, followed by filling the resulting trenches in substrate 320 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 324. STI regions 324 may include a liner dielectric (not shown), which may be a thermal oxide formed through a thermal oxidation of a surface layer of substrate 320. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 324 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 330 and the top surfaces of STI regions 324 may be substantially level with each other. Semiconductor strips 326 are between neighboring STI regions 324. In accordance with some embodiments of the present disclosure, semiconductor strips 326 are parts of the original substrate 320, and hence the material of semiconductor strips 326 is the same as that of substrate 320. In accordance with alternative embodiments of the present disclosure, semiconductor strips 326 are replacement strips formed by etching the portions of substrate 320 between STI regions 324 to form recesses, and performing an epitaxy to regrow another semiconductor material in the recesses. Accordingly, semiconductor strips 326 are formed of a semiconductor material different from that of substrate 320. In accordance with some embodiments, semiconductor strips 326 are formed of silicon germanium, silicon carbon, or a III-V compound semiconductor material.

Figure 14:
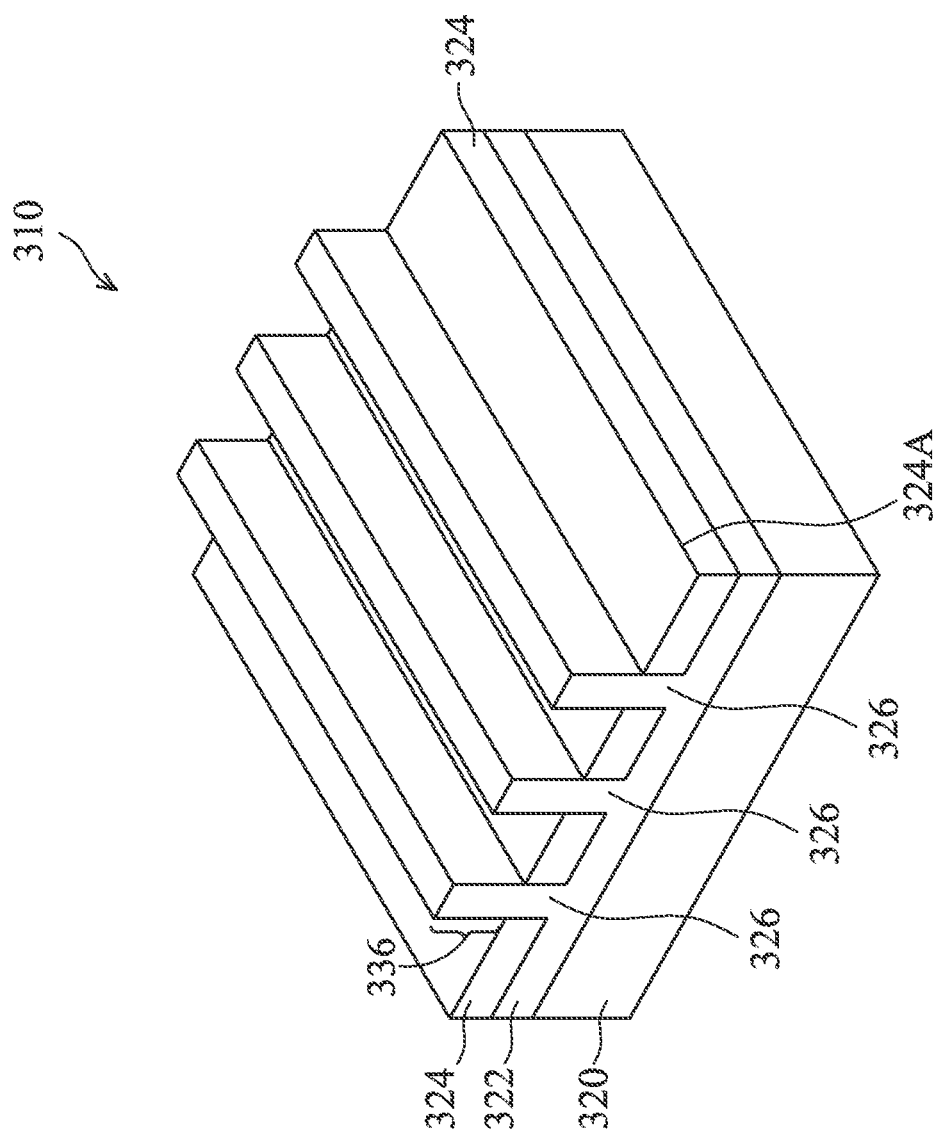

Referring to FIG. 14, STI regions 324 are recessed, so that the top portions of semiconductor strips 326 protrude higher than the top surfaces 324A of the remaining portions of STI regions 324 to form protruding fins 336. The etching may be performed using a dry etching process, wherein $HF_3$ and $NH_3$, for example, are used as the etching gases. During the etching process, plasma may be generated. Argon may also be included. In accordance with alternative embodiments of the present disclosure, the recessing of STI regions 324 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 15:
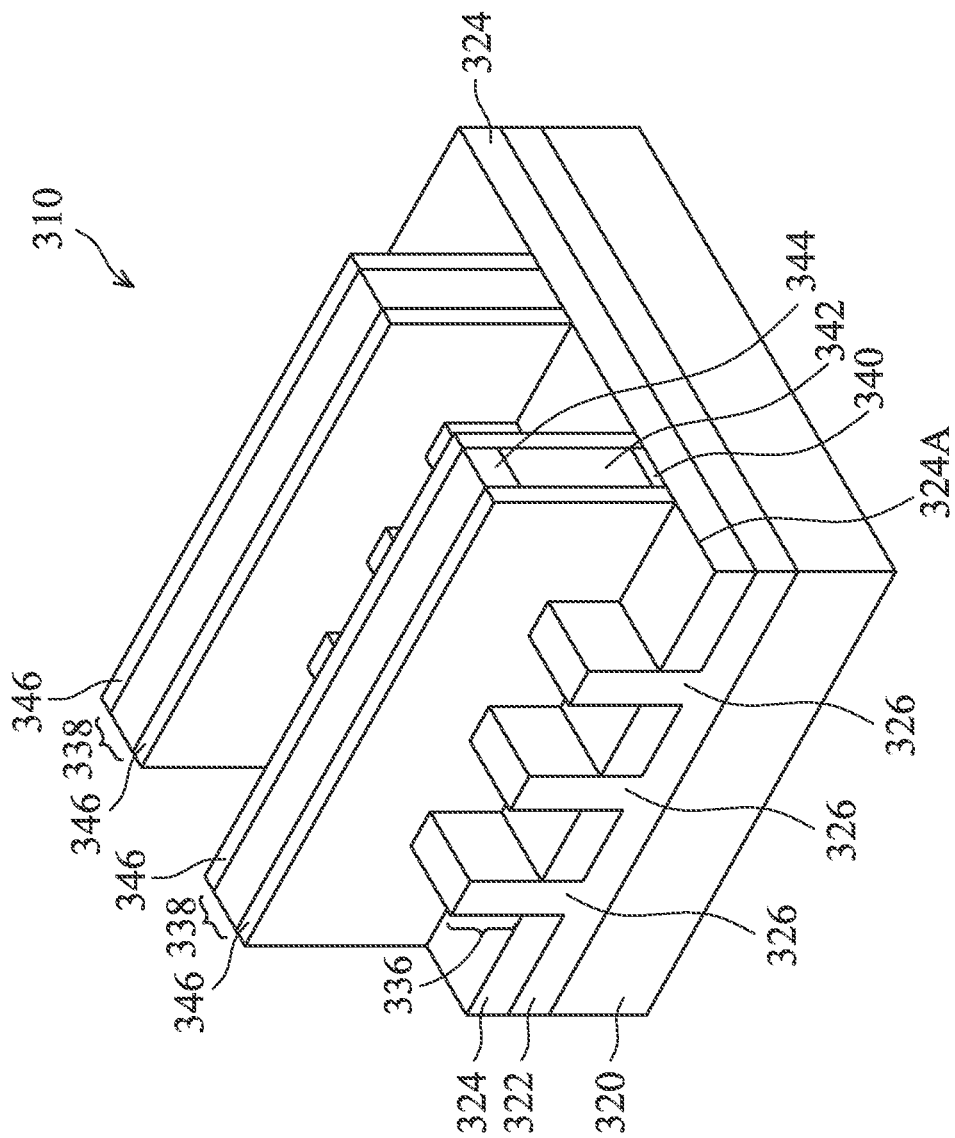

Referring to FIG. 15, dummy gate stacks 338 are formed to extend on the top surfaces and the sidewalls of (protruding) fins 336. Dummy gate stacks 338 may include dummy gate dielectrics 340 and dummy gate electrodes 342 over dummy gate dielectrics 340. Dummy gate electrodes 342 may be formed, for example, using polysilicon, and other materials may also be used. Each of dummy gate stacks 338 may also include one (or a plurality of) hard mask layer 344 over dummy gate electrodes 342. Hard mask layers 344 may be formed of silicon nitride, silicon oxide, silicon carbo-nitride, or multi-layers thereof. Dummy gate stacks 338 may cross over a single one or a plurality of protruding fins 336 and/or STI regions 324. Dummy gate stacks 338 also have lengthwise directions perpendicular to the lengthwise directions of protruding fins 336.

Next, gate spacers 346 are formed on the sidewalls of dummy gate stacks 338. In accordance with some embodiments of the present disclosure, gate spacers 346 are formed of a dielectric material(s) such as silicon nitride, silicon carbo-nitride, or the like, and may have a single-layer structure or a multi-layer structure including a plurality of dielectric layers.

Figure 16:
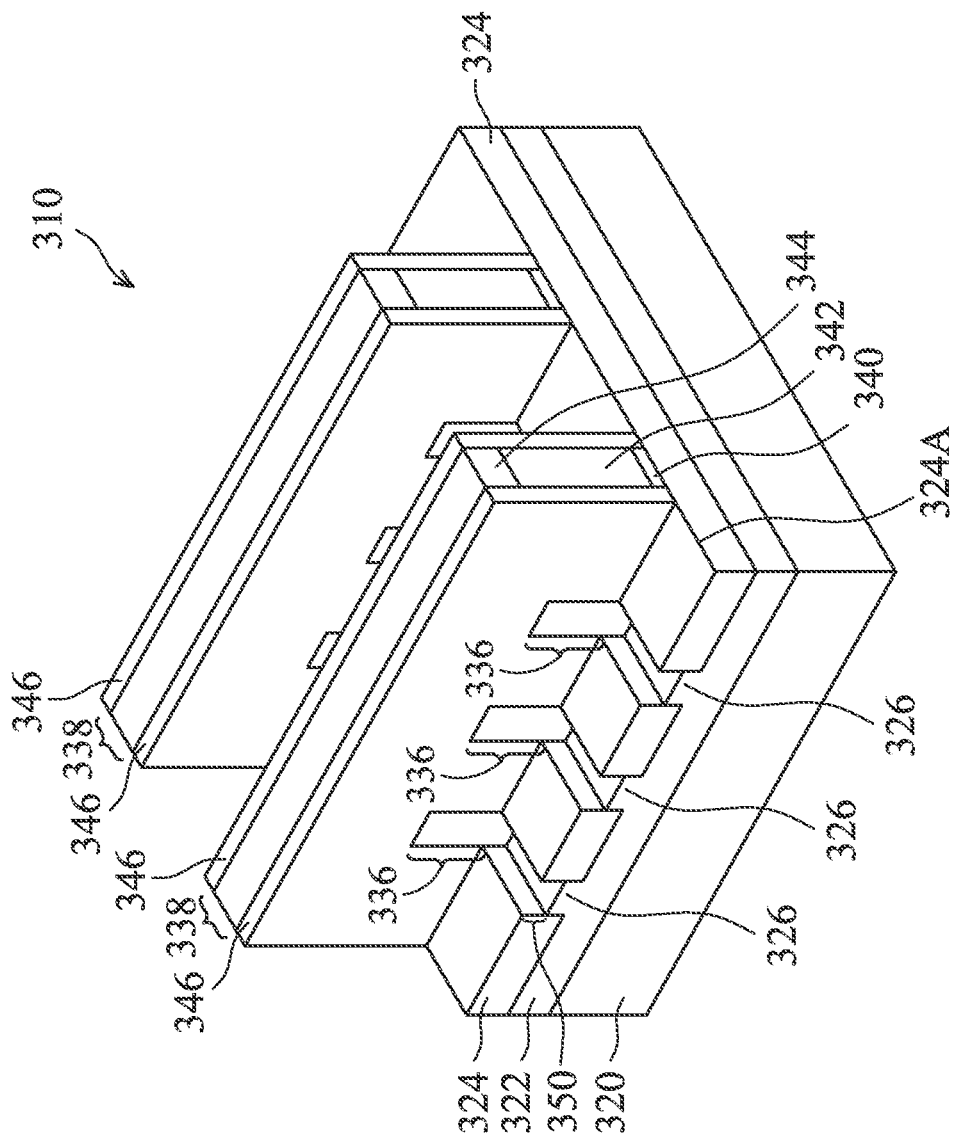

An etching process is then performed to etch the portions of protruding fins 336 that are not covered by dummy gate stacks 338 and gate spacers 346, resulting in the structure shown in FIG. 16. The etching may be anisotropic, and hence the portions of fins 336 directly underlying dummy gate stacks 338 and gate spacers 346 are protected, and are not etched. The top surfaces of the recessed semiconductor strips 326 may be lower than the top surfaces 324A of STI regions 324 in accordance with some embodiments. Recesses 350 are accordingly formed. Recesses 350 comprise portions located on the opposite sides of dummy gate stacks 338, and portions between remaining portions of protruding fins 336.

Figure 17:
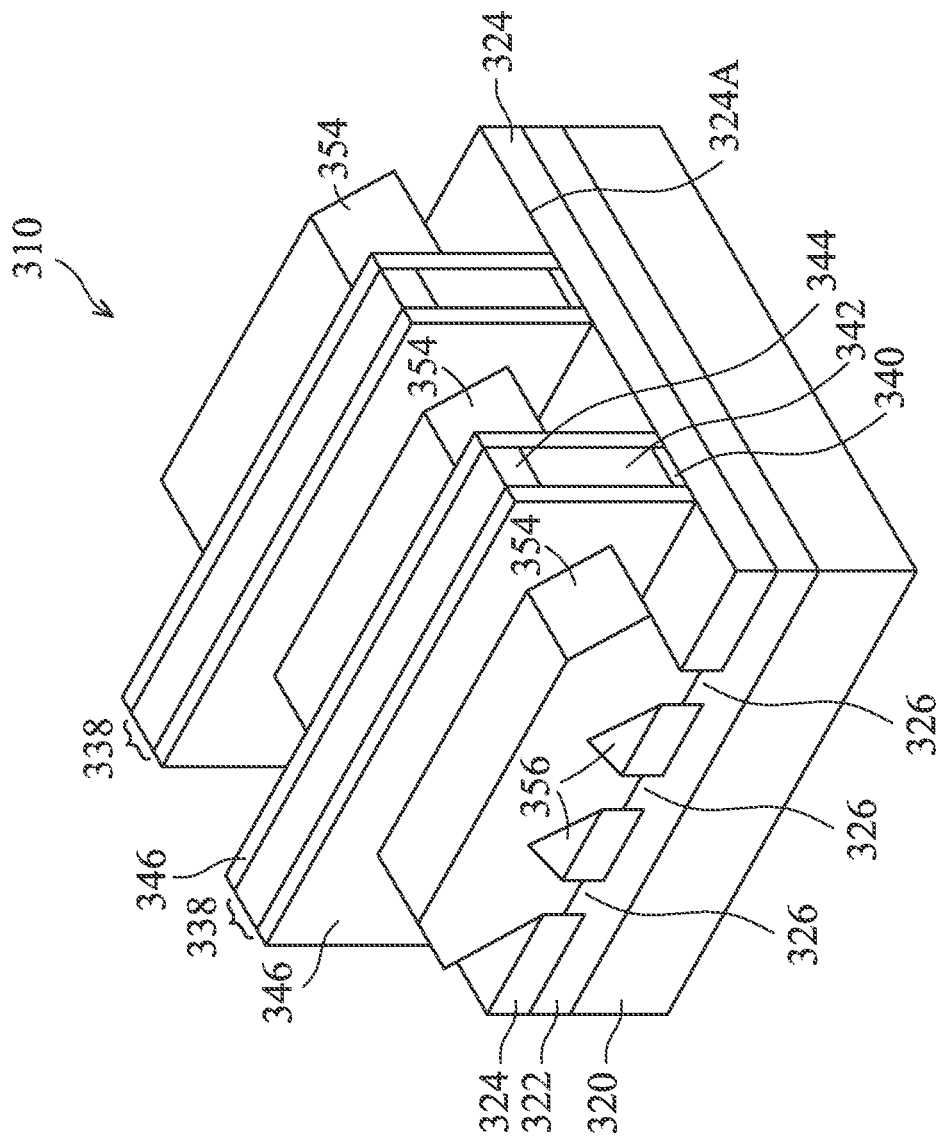

Next, epitaxy regions (source/drain regions) 354 are formed by selectively growing (through epitaxy) a semiconductor material in recesses 350, resulting in the structure in FIG. 17. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 354 comprise III-V compound semiconductors such as GaAs, InP, GaN, InGaAs, InAlAs, GaSb, AlSb, AlAs, AlP, GaP, combinations thereof, multi-layers thereof, or the like. After recesses 350 are filled with epitaxy regions 354, the further epitaxial growth of epitaxy regions 354 causes epitaxy regions 354 to expand horizontally, and facets may be formed. The further growth of epitaxy regions 354 may also cause neighboring epitaxy regions 354 to merge with each other. Voids (air gaps) 356 may be generated. In accordance with some embodiments of the present disclosure, the formation of epitaxy regions 354 may be finished when the top surface of epitaxy regions 354 is still wavy, or when the top surface of the merged epitaxy regions 354 has become substantially planar, which is achieved by further growing on the epitaxy regions 354 as shown in FIG. 17.

After the epitaxy process, epitaxy regions 354 may be further implanted with a p-type or an n-type impurity to form source and drain regions, which are also denoted using reference numeral 354. In accordance with alternative embodiments of the present disclosure, the implantation step is skipped when epitaxy regions 354 are in-situ doped with the p-type or n-type impurity during the epitaxy.

Figure 18:
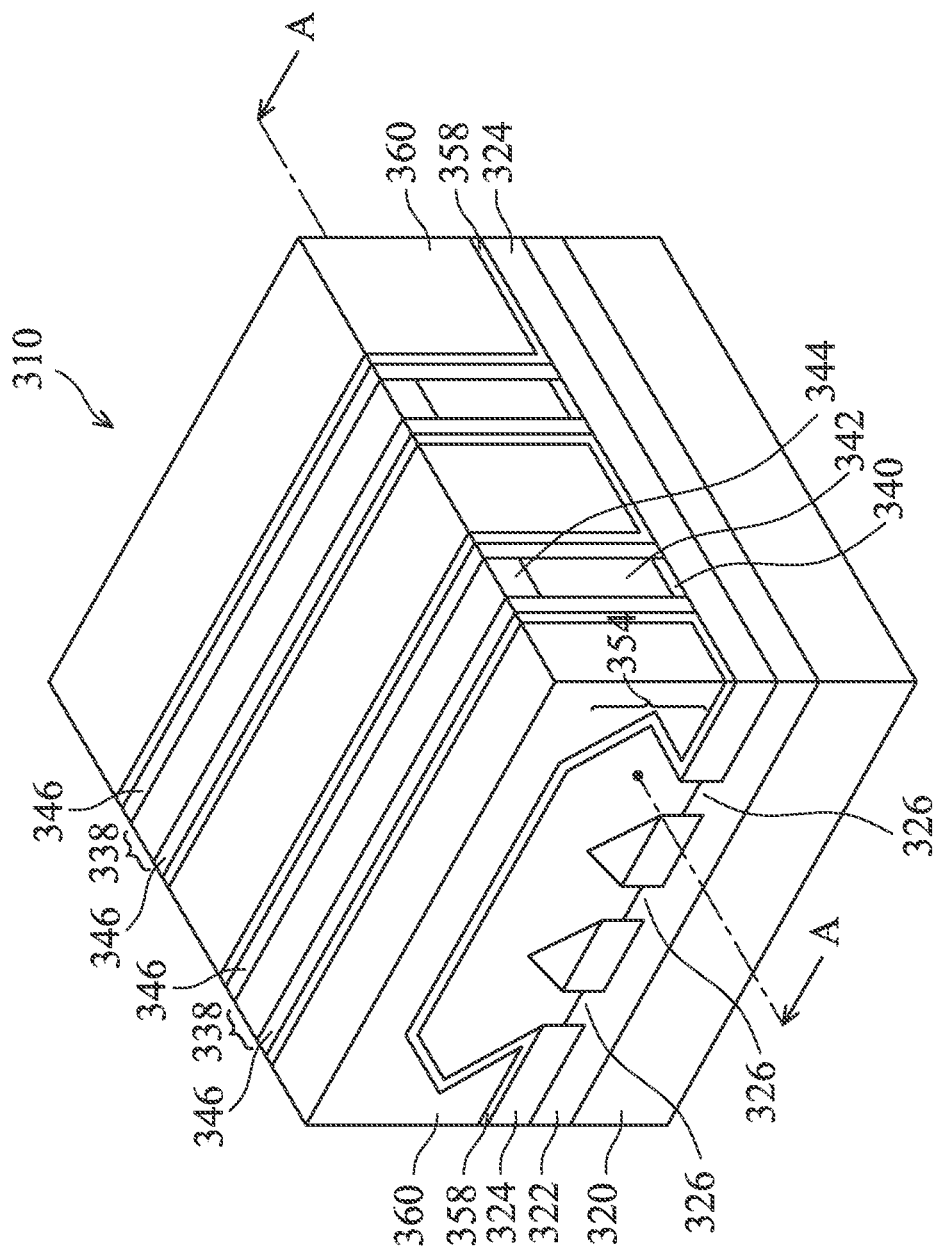

FIG. 18 illustrates a perspective view of the structure after the formation of Contact Etch Stop Layer (CESL) 358 and Inter-Layer Dielectric (ILD) 360. CESL 358 may be formed of silicon oxide, silicon nitride, silicon carbo-nitride, or the like, and may be formed using CVD, ALD, or the like. ILD 360 may include a dielectric material formed using, for example, FCVD, spin-on coating, CVD, or another deposition method. ILD 360 may be formed of an oxygen-containing dielectric material, which may be a silicon-oxide based material such as Tetra Ethyl Ortho Silicate (TEOS) oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 360, dummy gate stacks 338, and gate spacers 346 with each other.

Figure 19:
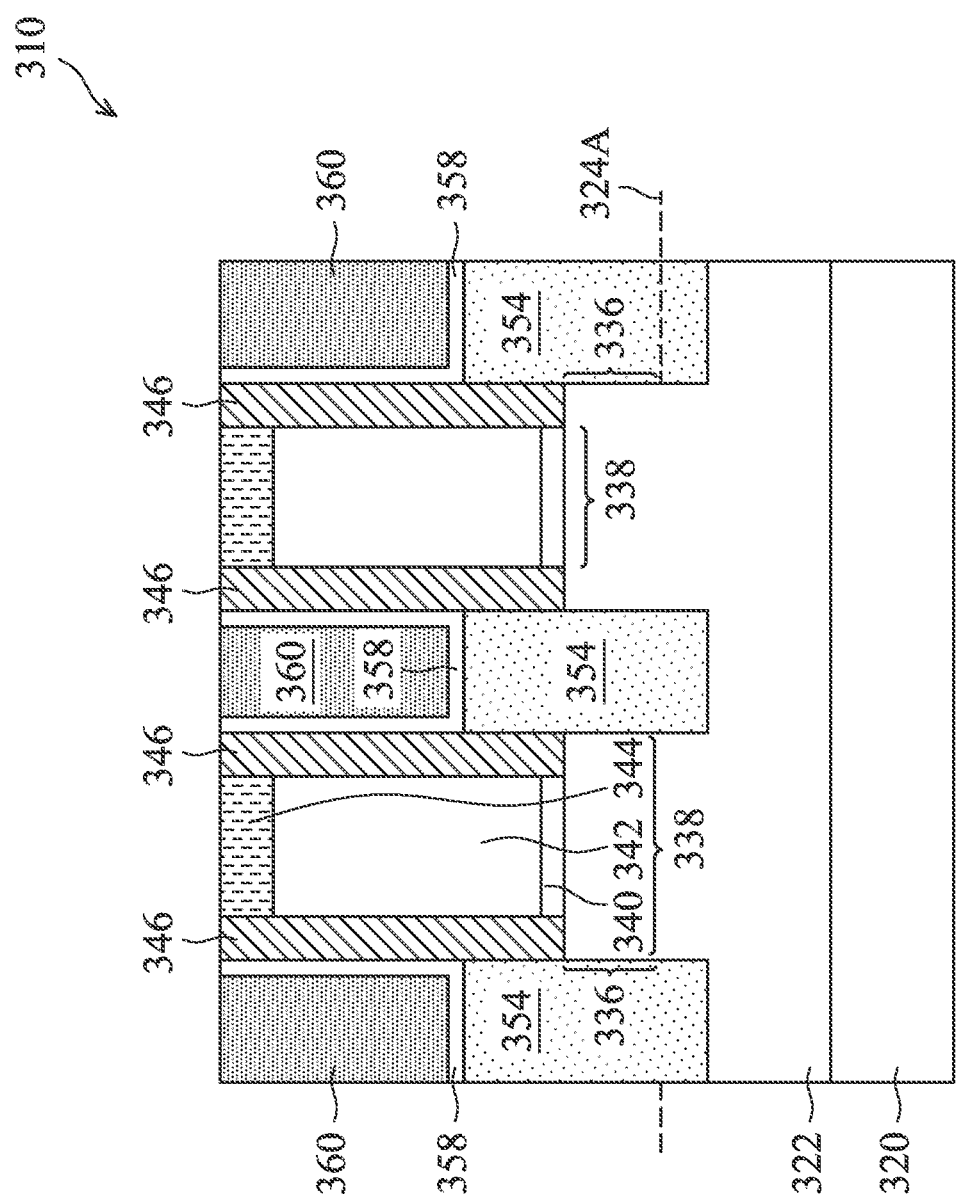
Figure 20:
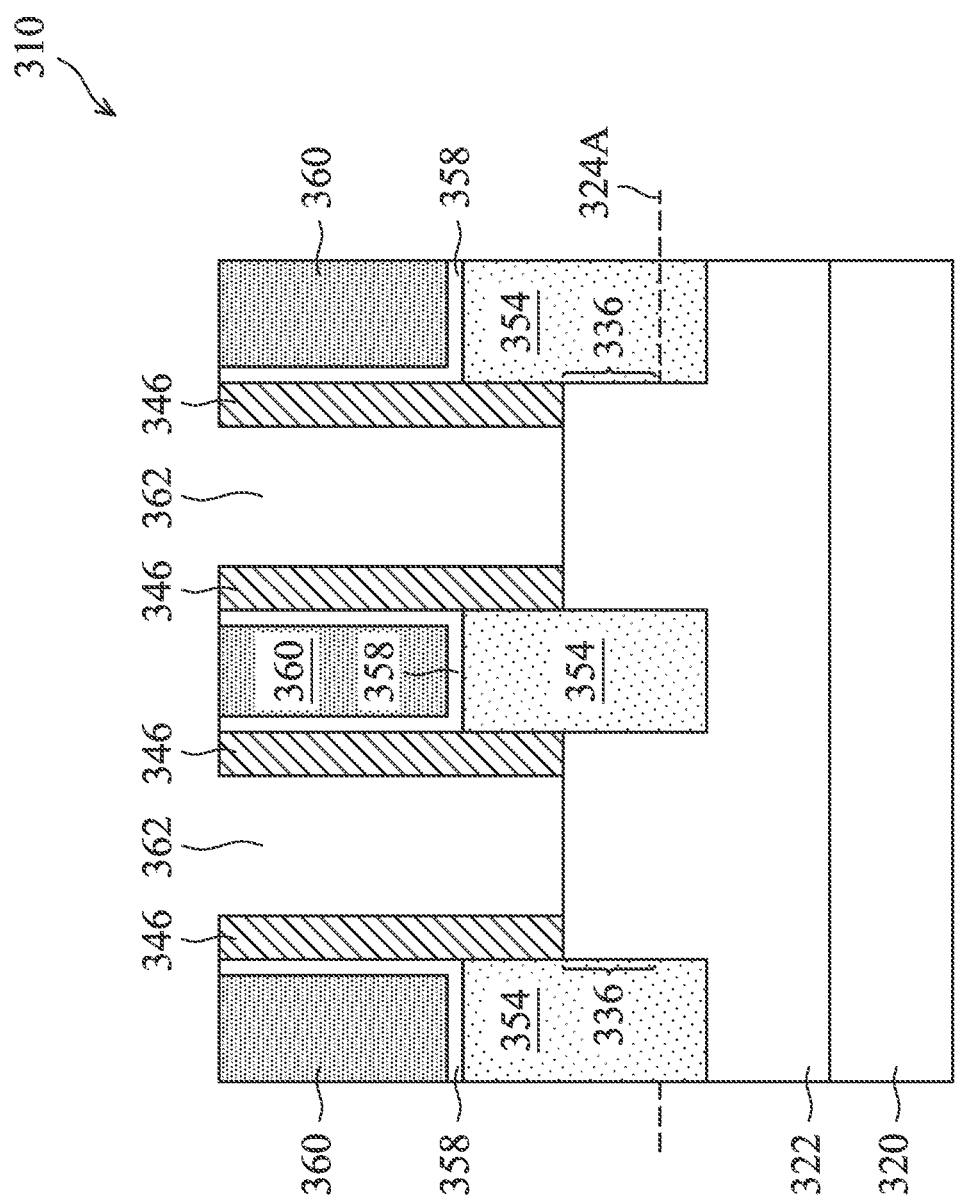

FIG. 19 illustrates the reference cross-section A-A in FIG. 18, in which dummy gate stacks 338 are illustrated. Next, the dummy gate stacks 338 including hard mask layers 344, dummy gate electrodes 342 and dummy gate dielectrics 340 are etched, forming trenches 362 between gate spacers 346, as shown in FIG. 20. The top surfaces and the sidewalls of protruding fins 336 are exposed to trenches 362.

Figure 21:
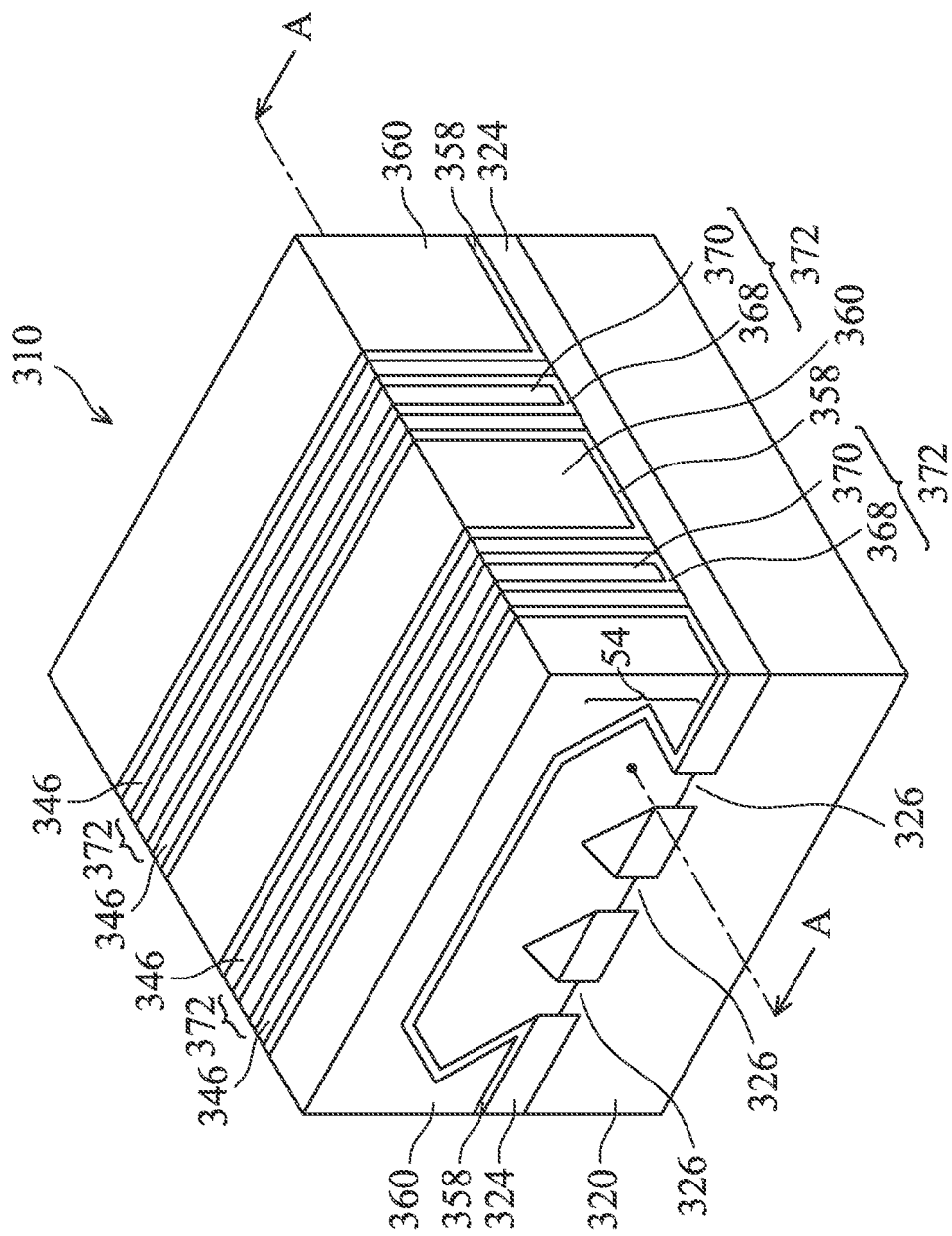
Figure 22:
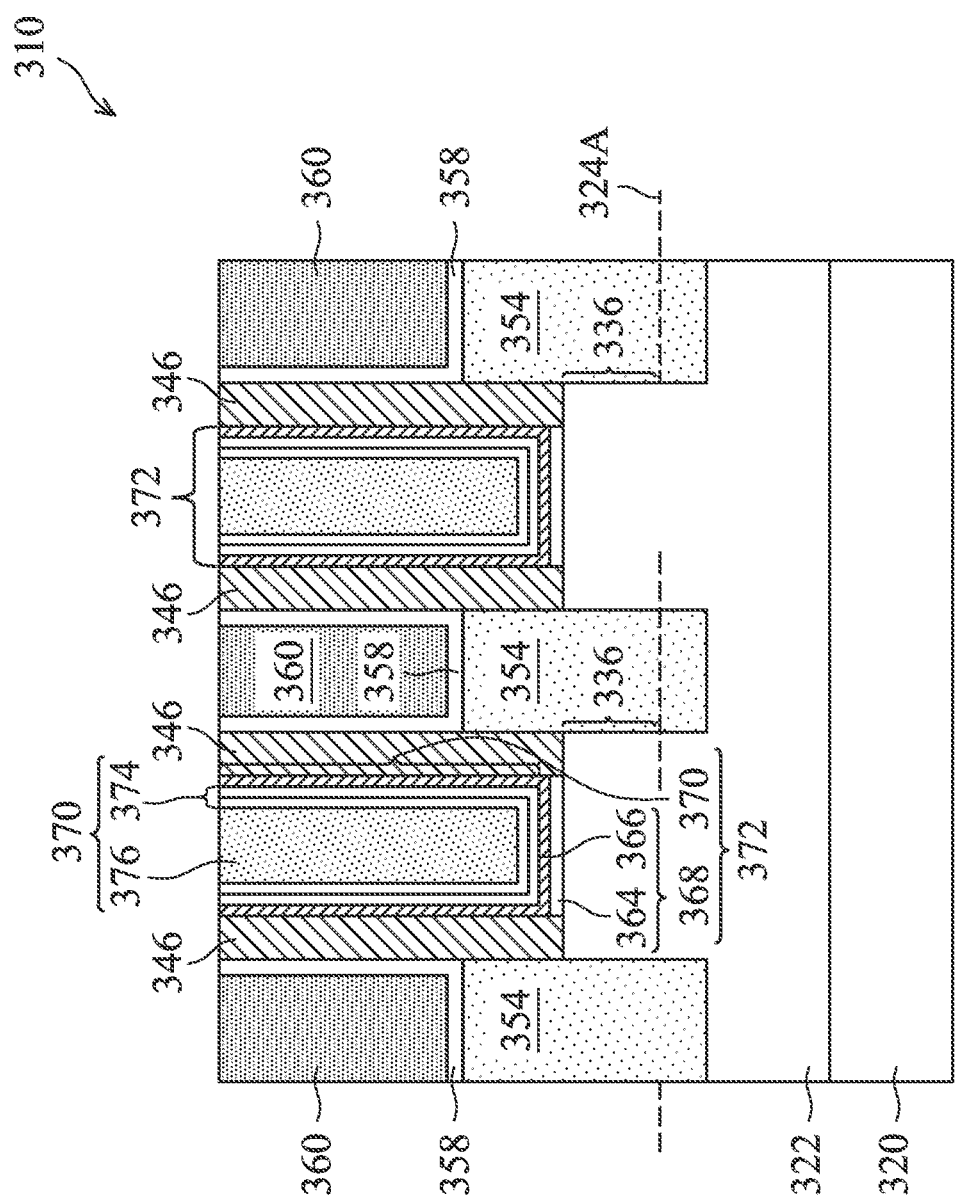

Next, as shown in FIGS. 21 and 22, replacement gate stacks 372 are formed in trenches 362 (FIG. 20). FIG. 22 illustrates the reference cross-section A-A in FIG. 21. Replacement gate stacks 372 include gate dielectrics 368 and the corresponding gate electrodes 370.

In accordance with some embodiments of the present disclosure, a gate dielectric 368 includes Interfacial Layer (IL) 364 as its lower part. IL 364 is formed on the exposed surfaces of protruding fins 336. IL 364 may include an oxide layer such as a silicon oxide layer, which is formed through the thermal oxidation of protruding fins 336, a chemical oxidation process, or a deposition process. Gate dielectric 368 may also include high-k dielectric layer 366 formed over IL 364. High-k dielectric layer 366 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0, and sometimes as high as 21.0 or higher. High-k dielectric layer 366 is overlying, and may contact, IL 364. High-k dielectric layer 366 is formed as a conformal layer, and extends on the sidewalls of protruding fins 336 and the top surface and the sidewalls of gate spacers 346. In accordance with some embodiments of the present disclosure, high-k dielectric layer 366 is formed using ALD, CVD, PECVD, Molecular-Beam Deposition (MBD), or the like.

Further referring to FIG. 22, gate electrode 370 is formed on gate dielectric 368. Gate electrode 370 may include a plurality of metal-containing layers 374, which may be formed as conformal layers, and filling-metal regions 376 filling the rest of the trenches unfilled by the plurality of metal-containing layers 374. Metal-containing layers 374 may include a barrier layer, a work-function layer over the barrier layer, and one or a plurality of metal capping layers over the work-function layer.

Figure 23:
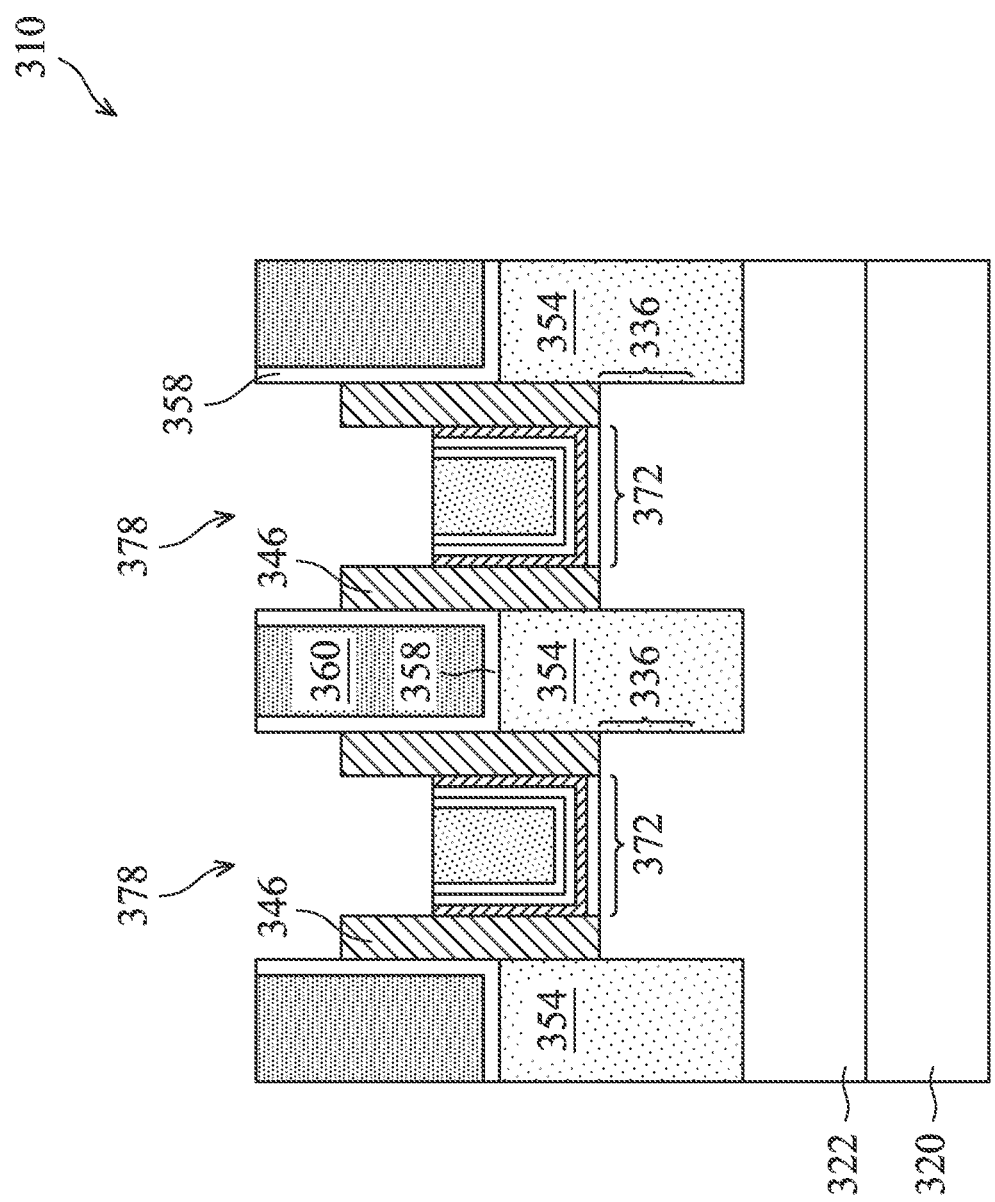

FIG. 23 illustrates the recessing of gate stacks 372 and gate spacers 346 to form recesses 378, in accordance with some embodiments. The recesses 378 may be formed using, for example, one or more anisotropic etching processes. The etching processes may be performed, for example, using one or more etching gases that have a high etching selectivity of the materials of gate stacks 372 over the material of CESL 358 or ILD 360, such that CESL 358 or ILD 360 are not significantly etched or damaged. FIG. 23 shows recesses 378 with top surfaces of gate spacers 346 above top surfaces of gate stacks 372, but in other embodiments, top surfaces of gate spacers 346 are level with top surfaces of gate stacks 372. In other embodiments, gate spacers 346 are not recessed.

Figure 24:
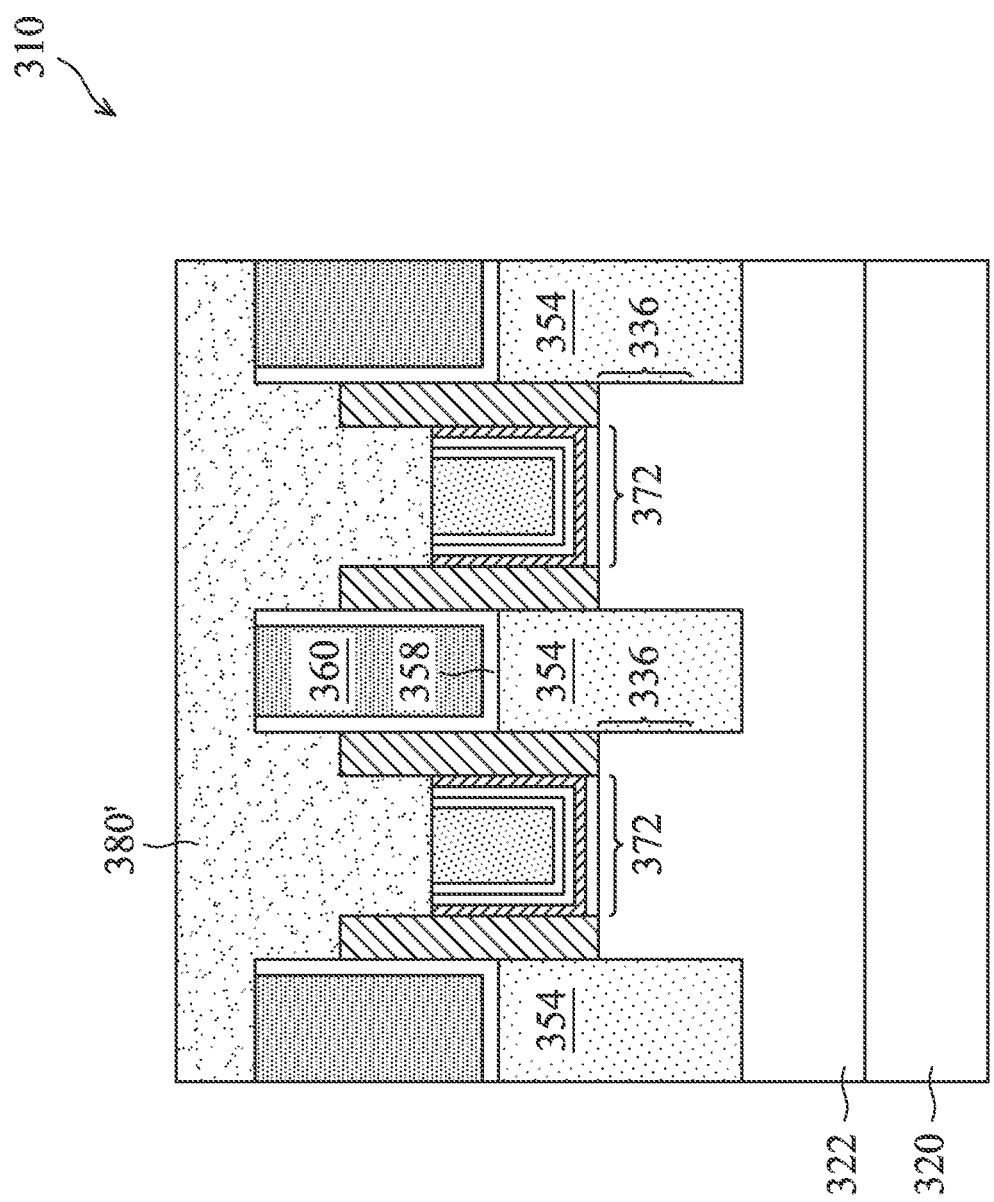

In FIG. 24, a hard mask material 380' is deposited over the structure and within recesses 378 using a capillary-assisted ALD process, in accordance with some embodiments. The capillary-assisted ALD process may be similar to capillary-assisted ALD process described hereinabove. The hard mask material 380' is used to form hard masks 380 that cover gate stacks 372, shown in FIG. 24. In some embodiments, hard mask material 380' may be a metal oxide (e.g., aluminum oxide) deposited by the capillary-assisted ALD process using the process parameters and precursors described previously. In some cases, aluminum oxide may have a high etch selectivity relative to the materials of other features such as CESL 358 or ILD 360. For example, a higher etch selectivity of a hard mask material 380' of aluminum oxide over a CESL 358 or an ILD 360 formed of silicon oxide, silicon nitride, or the like can allow the subsequently formed gate contact openings 386 (see FIG. 27) to be formed through hard masks 380 (see FIG. 25) with reduced risk of etch damage or etch loss, or risk of bridging during formation of the gate contacts 388 (see FIG. 28). In this manner, the higher etch selectivity of hard masks 380 formed of a metal oxide can allow for the gate contacts 388 to be formed as self-aligned contacts. Additionally, the use of the capillary-assisted ALD process to deposit hard mask material 380' can allow for hard masks 380 to be formed with reduced risk of seams or voids and also allow for improved gap-filling of recesses 378 due to the capillary forces described previously. Other materials, process parameters, or precursors may be used for forming the hard mask material 380' in other embodiments.

Figure 25:
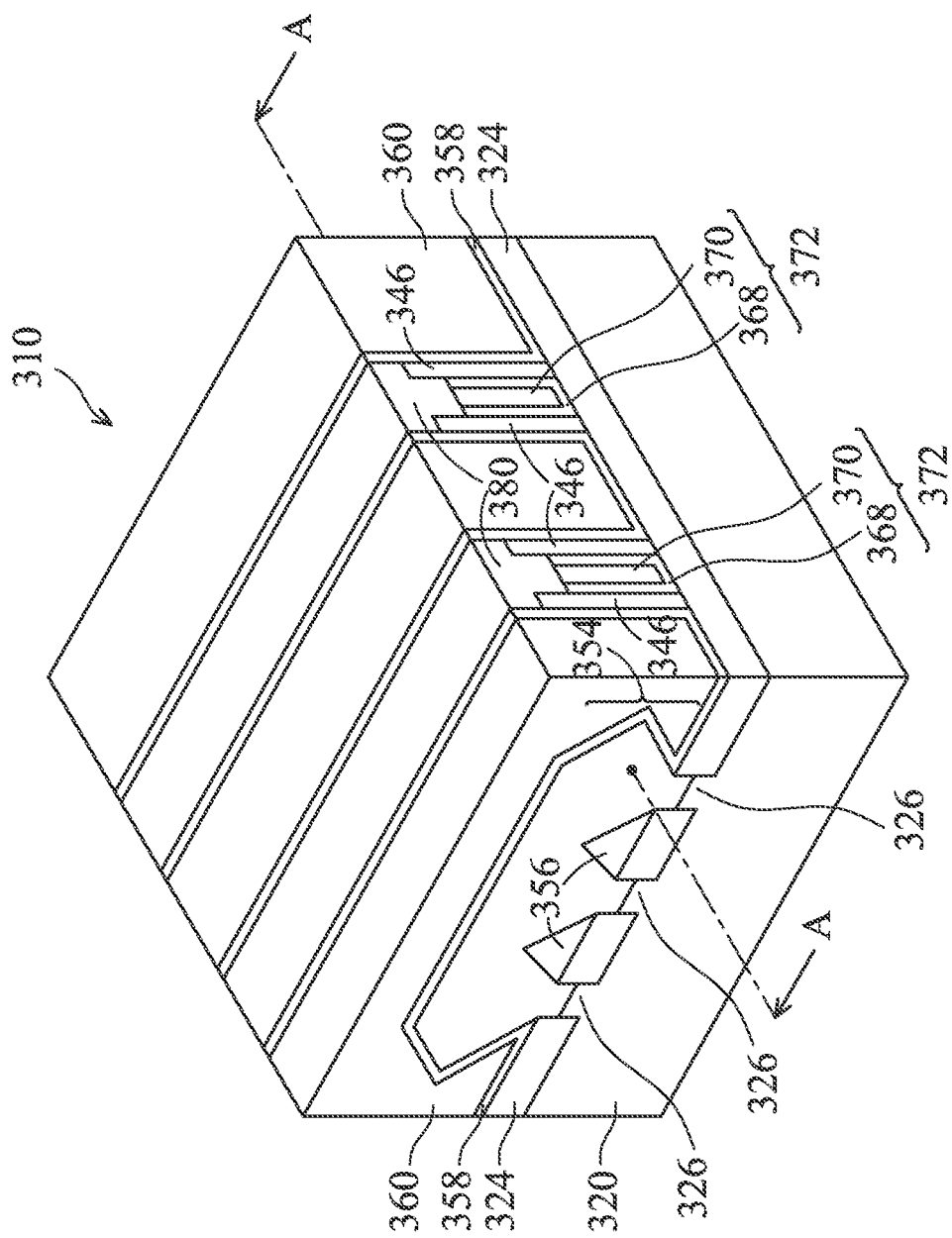
Figure 26:
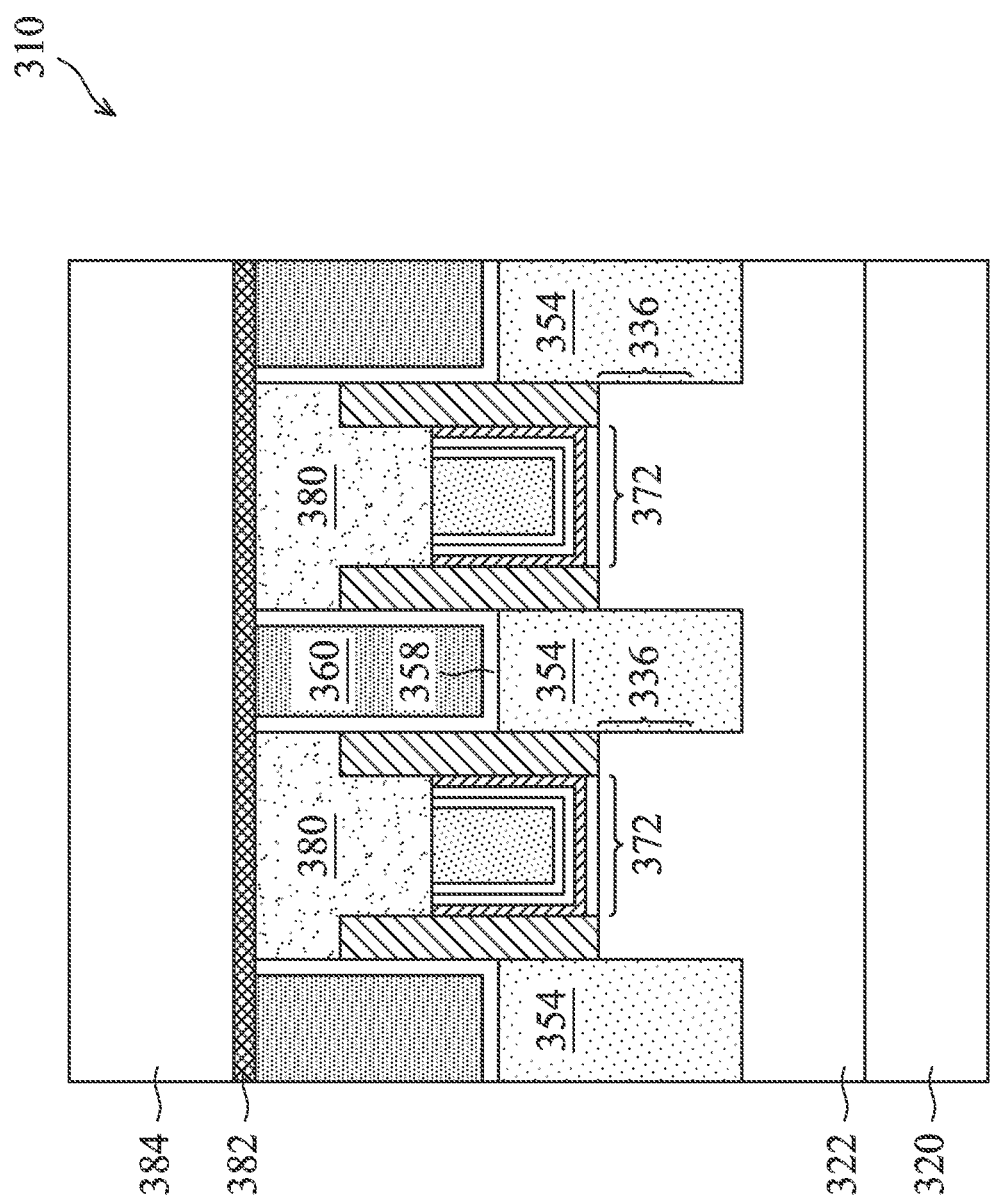

FIG. 25 illustrates a perspective view of the formation of hard masks 380 in accordance with some embodiments. After the hard mask material 380' has been deposited, the hard mask material 380' may be planarized to remove excess material, forming hard masks 380. The hard mask material 380' may be planarized using, for example, a CMP or grinding process to remove excess material. ILD 360 may be exposed by the planarization process, and ILD 360 may also be planarized.

FIG. 24 illustrates a cross-sectional view (along A-A) of the formation of etch stop layer 382 and hard mask 384, in accordance with some embodiments. Etch stop layer 382 and hard mask 384 may be used for forming and preserving the patterns of gate contact openings 386 (see FIG. 27). Etch stop layer 382 may be formed of an oxide, a nitride, a carbide, an oxycarbide, or the like. Hard mask 384 may be formed of titanium nitride, boron nitride, oxide, nitride, or the like. In other embodiments, etch stop layer 382 is not formed. In other embodiments, neither etch stop layer 382 nor hard mask 384 are formed, and thus gate contact openings 386 are formed without the use of etch stop layer 382 or hard mask 384.

Figure 27:
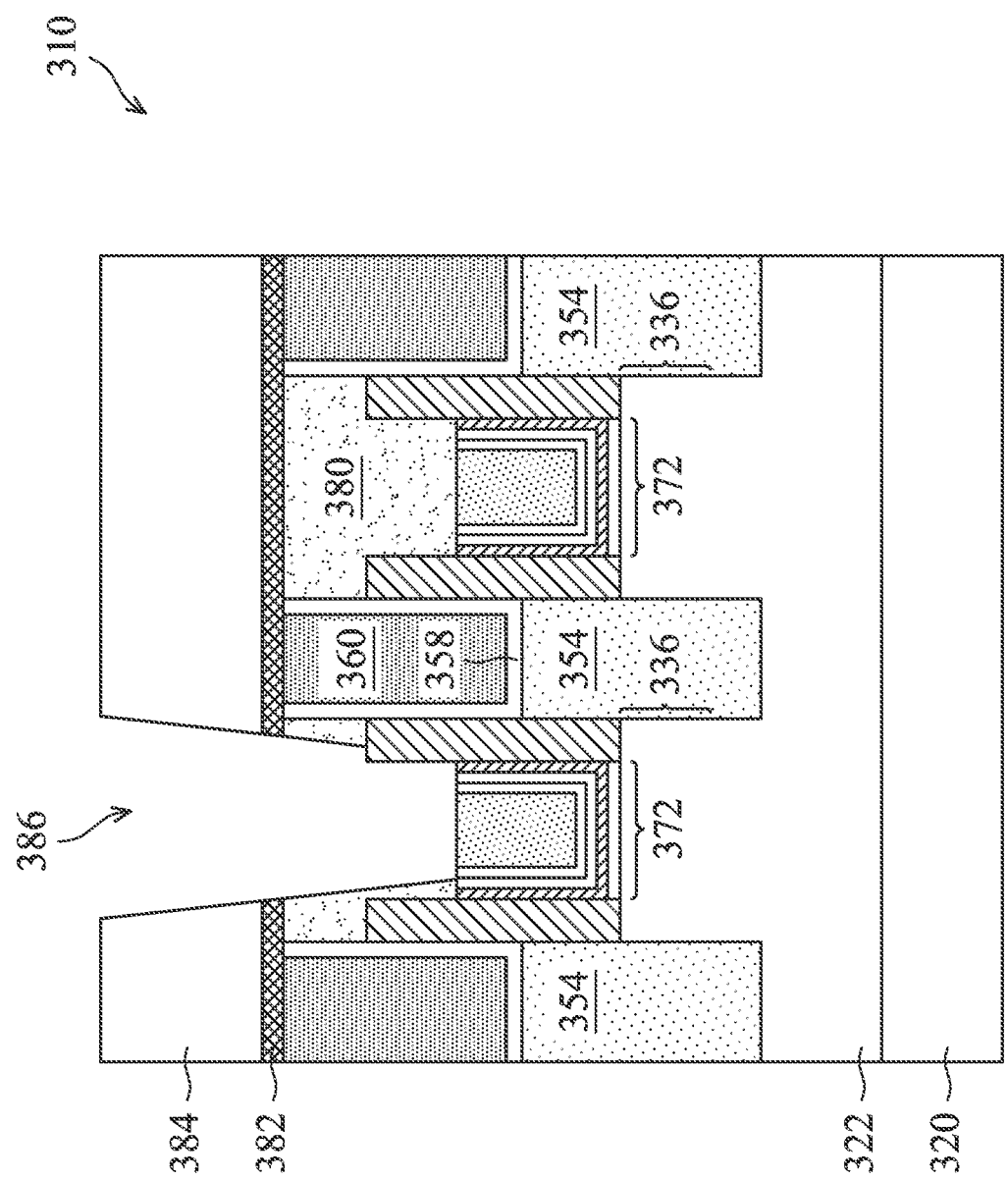

FIG. 27 illustrates the formation of gate contact openings 386, in accordance with some embodiments. Gate contact openings 386 are formed to expose gate stacks 372. In some embodiments, a photoresist (not shown) is formed over hard mask 384 and patterned, and then hard mask 384 and etch stop layer 382 are etched using the patterned photo resist as an etching mask. Portions of hard mask 384 and etch stop layer 382 may be etched in this manner so that openings 386 are formed in hard mask 384 and etch stop layer 382 that expose hard masks 380. Next, hard masks 380 may be etched to extend gate contact openings 386 through hard masks 380 and expose gate stacks 372. Gate contact openings 386 may be may be etched using, for example, one or more anisotropic etching processes. The anisotropic etching processes may include an etching process having a high selectivity to the material of hard masks 380 over the material of gate spacers 346.

Figure 28:
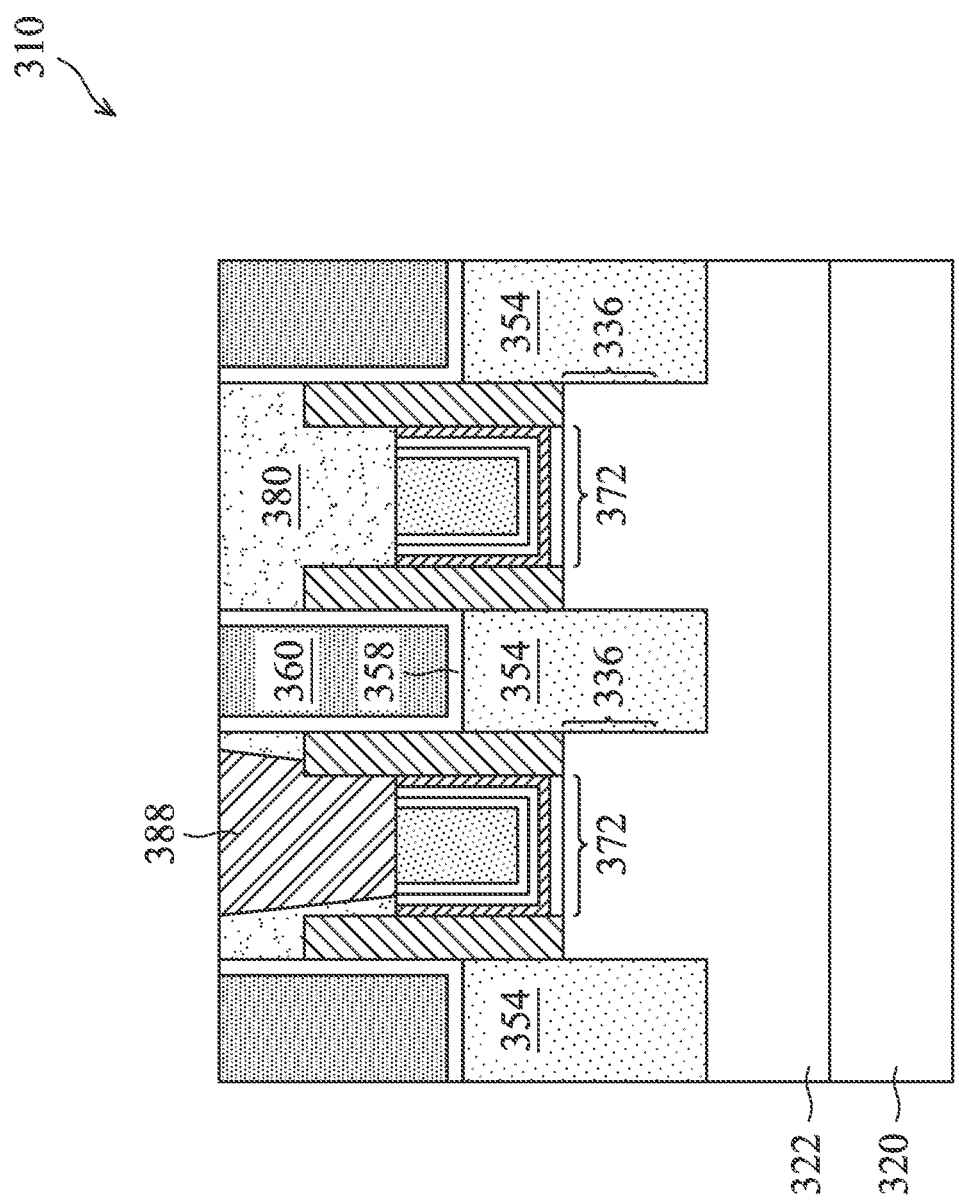

Next, in FIG. 28, gate contacts 388 are formed in gate contact openings 386, in accordance with some embodiments. Gate contacts 388 may be formed by filling gate contact openings 386 with conductive material. The conductive material may include a diffusion barrier layer, which may be formed of titanium nitride, tantalum nitride, titanium, tantalum, or the like, and a conductive filling material such as copper, tungsten, cobalt, aluminum, ruthenium, the like, or combinations thereof. Other conductive materials are possible. The conductive material may be formed over upper surfaces of hard mask 384. After forming the conductive material, a planarization process may be performed to remove excess conductive material. In some embodiments, the planarization process may also remove hard mask 384 and etch stop layer 382, as shown in FIG. 28.

Although not explicitly shown, a person having ordinary skill in the art will readily understand that further processing steps may be performed on the structures in FIG. 28. For example, source/drain contacts may be formed to contact the source/drain regions (that is, the epitaxy regions 354), or various Inter-Metal Dielectrics (IMD) and their corresponding metallizations may be formed over the ILD 360.

While the hard mask material 380' is described as being formed using the capillary-assisted ALD process described herein, it should be noted that the capillary-assisted ALD process described herein may be used to deposit materials for other process steps in the formation of FinFETs, other structures, or other devices. Accordingly, the capillary-assisted ALD process described herein can be used in various processing steps for depositing a gap-filling material, and the techniques described are not limited the examples and embodiments described herein.

The embodiments herein allow for advantages. Using the capillary-assisted ALD techniques described herein, a material may be deposited in narrow or confined regions without the formation of defects such as seams or voids. The capillary-assisted ALD technique allows for simultaneous bottom-up deposition (e.g., in narrow or confined regions) and conformal deposition (e.g., on top surfaces or corners), which can allow for more efficient gap-filling with improved deposition quality. The techniques described herein are compatible with both thermal ALD and plasma ALD. The techniques described herein also allow for the bottom-up deposition of materials without the use of inhibitors or other additives, and thus can avoid defects due to the presence of inhibitors or other additives. The capillary-assisted ALD process described herein also allows for the deposition of a large variety of materials for a large variety of applications, including materials incompatible with other deposition processes such as metal oxides or materials that use water as a precursor. For example, the techniques described herein may be used for processes including, but not limited to, FinFET formation, gate-all-around (GAA) or nanostructure FET formation, Front End of Line (FEOL) processes, or Back End of Line (BEOL) processes.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are formed by patterning a stack of alternating layers of channel layers and sacrificial layers. The dummy gate stacks and epitaxial source/drain regions are formed in a similar manner as described above. After the dummy gate stacks are removed, the sacrificial layers can be partially or fully removed in the channel regions. The replacement gate structures are formed in a similar manner as described above and will partially or completely surround the channel layers in the channel region of the NSFET devices. The ILDs and contacts to the gate structures and source/drains are formed in a similar manner as described above. A nanostructure device can be formed as disclosed in U.S. Patent Application Publication 2016/0365414, which is incorporated herein by reference in its entirety.

In accordance with an embodiment, a method includes placing a semiconductor substrate in a deposition chamber, wherein the semiconductor substrate includes a trench; and performing an atomic layer deposition (ALD) process to deposit a dielectric material within the trench, including flowing a first precursor of the dielectric material into the deposition chamber as a gas phase; flowing a second precursor of the dielectric material into the deposition chamber as a gas phase; and controlling the pressure and temperature within the deposition chamber such that the second precursor condenses on surfaces within the trench as a liquid phase of the second precursor, wherein the liquid phase of the second precursor has capillarity. In an embodiment, the liquid phase of the second precursor forms in a thicker layer on surfaces within the trench that are near the bottom of the trench than on surfaces within the trench that are near the top of the trench. In an embodiment, the first precursor of the dielectric material condenses on surfaces within the trench as a liquid phase of the first precursor, and the liquid phase of the first precursor has capillarity. In an embodiment, the dielectric material fills the trench, and the dielectric material filling the trench is free of seams. In an embodiment, the dielectric material is aluminum oxide. In an embodiment, the first precursor is trimethylaluminum (TMA). In an embodiment, the second precursor is water. In an embodiment, while flowing the second precursor into the deposition chamber, the pressure within the deposition chamber is controlled to be between 0.5 Torr and 50 Torr, and the temperature within the deposition chamber is controlled to be between 30° C. and 300° C.

In accordance with an embodiment, a method includes forming a semiconductor structure including a trench in a substrate; and depositing a dielectric material within the trench using an Atomic Layer Deposition (ALD) process performed using a process chamber, wherein the ALD process includes an ALD cycle including exposing the semiconductor structure to a first precursor; and exposing the semiconductor structure to a second precursor, wherein the second precursor condenses on surfaces of the semiconductor structure as a liquid having capillarity; wherein a vertical deposition rate of the dielectric material from a bottom surface of the trench is greater than a lateral deposition rate of the dielectric material from a sidewall of the trench. In an embodiment, the dielectric material includes silicon nitride, the first precursor includes $SiH_2Cl_2$ or $SiH_2I_2$, and the second precursor is ammonia ($NH_3$). In an embodiment, the ALD process includes flowing the first precursor or the second precursor into the process chamber at a flow rate between 10 sccm and 2000 sccm, using a process pressure between 0.5 Torr and 6 Torr, and using a process temperature between 150° C. and 600° C. In an embodiment, the dielectric material includes zirconium oxide, the first precursor includes $ZrCl_4$ or $CpZr(NMe_2)_3$, and the second precursor is water. In an embodiment, the ALD process includes using a process pressure between 0.5 Torr and 6 Torr and using a process temperature between 250° C. and 350° C. In an embodiment, the dielectric material includes aluminum oxide, the first precursor is trimethylaluminum (TMA), and the second precursor is water. In an embodiment, the ALD process is free of inhibitors. In an embodiment, the ALD process deposits the dielectric material to fill the trench and conformally deposits the dielectric material on a top surface of the substrate, wherein the dielectric material filling the trench is seam-free.

In accordance with an embodiment, a semiconductor device includes a fin protruding from a substrate; an isolation region surrounding the fin; a gate stack over the fin; a source/drain region in the fin adjacent the gate stack; an inter-layer dielectric (ILD) over the source/drain region, wherein a top surface of the gate stack is recessed from a top surface of the ILD; a hard mask covering the gate stack, wherein a top surface of the hard mask is level with the top surface of the ILD, wherein the hard mask is free of seams, wherein the hard mask has a height:width aspect ratio in a range between 1:3 and 1:25; and wherein the hard mask comprises a metal oxide; and a conductive feature extending through the hard mask to contact the gate stack. In an embodiment, the metal oxide is aluminum oxide, zirconium oxide, or halfnium oxide. In an embodiment, the semiconductor device includes gate spacers along sidewalls of the gate stack, wherein the hard mask covers the gate spacers. In an embodiment, the hard mask has a smallest width in a range between 3 nm and 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin protruding from a semiconductor substrate;
   forming a gate stack over and along sidewalls of the fin;
   forming an isolation region over the fin and surrounding the gate stack; and
   depositing a dielectric material on the gate stack, comprising flowing a plurality of gaseous precursors over the gate stack, wherein at least one gaseous precursor of the plurality of gaseous precursors condenses on surfaces as a liquid having capillarity.

2. The method of claim 1 further comprising recessing a top surface of the gate stack before depositing the dielectric material.

3. The method of claim 1, wherein the dielectric material is free of seams.

4. The method of claim 1, wherein the at least one gaseous precursor comprises water.

5. The method of claim 1, wherein the dielectric material comprises aluminum oxide.

6. The method of claim 1, wherein the liquid condenses into a thicker layer on bottom surfaces than on sidewall surfaces.

7. The method of claim 1, wherein the dielectric material is deposited over the isolation region.

8. The method of claim 1, wherein the dielectric material is deposited using an Atomic Layer Deposition (ALD) process.

9. A method comprising:
   forming a plurality of semiconductor fins on a substrate;
   forming a gate structure extending over the plurality of semiconductor fins;
   forming spacers on sidewalls of the gate structure;
   performing an etching process to recess the gate structure and the spacers; and
   performing a deposition process to form a hard mask material on the gate structure and the spacers, wherein the deposition process comprises:
      introducing a first precursor into a process chamber as a gas, wherein the first precursor remains a gas during the deposition process; and
      introducing a second precursor into the process chamber as a gas, wherein the second precursor condenses into a liquid during the deposition process.

10. The method of claim 9, wherein a vertical deposition rate of the hard mask material is greater than a lateral deposition rate of the hard mask material.

11. The method of claim 9, wherein the liquid has capillarity.

12. The method of claim 9 further comprising forming a contact penetrating the hard mask material to contact the gate structure.

13. The method of claim 9, wherein the hard mask material comprises silicon nitride.

14. The method of claim 9, wherein the second precursor comprises ammonia.

15. The method of claim 9, wherein the first precursor comprises trimethylaluminum (TMA).

16. The method of claim 9, wherein the deposition process comprises a process pressure in the range of 0.5 Torr to 50 Torr and a process temperature in the range of 30° C. to 300° C.

17. A method comprising:
   forming a fin protruding from a substrate;
   forming an isolation region surrounding the fin;
   forming a gate stack over the fin;
   forming a source/drain region in the fin adjacent the gate stack;
   forming an inter-layer dielectric (ILD) over the source/drain region, wherein a top surface of the gate stack is recessed from a top surface of the ILD;
   forming a hard mask covering the gate stack, wherein a top surface of the hard mask is level with the top surface of the ILD, wherein the hard mask is free of seams, wherein the hard mask has a height:width aspect ratio in the range between 1:3 and 1:25; and wherein the hard mask comprises a metal oxide; and
   forming a conductive feature extending through the hard mask to contact the gate stack.

18. The method of claim 17, wherein the metal oxide is aluminum oxide, zirconium oxide, or hafnium oxide.

19. The method of claim 17 further comprising forming gate spacers along sidewalls of the gate stack, wherein the hard mask covers the gate spacers.

20. The method of claim 17, wherein the hard mask has a smallest width in the range between 3 nm and 10 nm.

* * * * *